US009275596B2

(12) United States Patent
Suzuki

(10) Patent No.: US 9,275,596 B2

(45) Date of Patent: Mar. 1, 2016

(54) SIGNAL-LINE DRIVING CIRCUIT, DISPLAY DEVICE AND ELECTRONIC EQUIPMENTS

(75) Inventor: Toshio Suzuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 959 days.

(21) Appl. No.: 12/271,622

(22) Filed: Nov. 14, 2008

(65) Prior Publication Data

US 2009/0167667 A1 Jul. 2, 2009

(30) Foreign Application Priority Data

Dec. 28, 2007 (JP) ................................ 2007-338996

(51) Int. Cl.
*G09G 3/36* (2006.01)
*H03F 3/30* (2006.01)

(52) U.S. Cl.
CPC ............ *G09G 3/3688* (2013.01); *G09G 3/3614* (2013.01); *G09G 2310/0281* (2013.01); *G09G 2310/0297* (2013.01)

(58) Field of Classification Search
USPC ...................... 315/397; 330/252, 255, 305, 9; 340/10.1; 341/144; 345/100, 212, 690, 345/87, 89, 98; 348/185; 360/66; 363/73; 455/264
See application file for complete search history.

(56) References Cited

U.S. PATENT DOCUMENTS

| | | | | |
|---|---|---|---|---|
| 6,304,241 | B1 | 10/2001 | Udo et al. | |
| 6,480,178 | B1 * | 11/2002 | Itakura | G09G 3/3688 330/251 |
| 6,781,605 | B2 * | 8/2004 | Kudo et al. | 345/690 |
| 6,970,152 | B1 * | 11/2005 | Bell | G09G 3/3688 330/123 |
| 2002/0041274 | A1 | 4/2002 | Watanabe | |
| 2002/0067207 | A1 * | 6/2002 | Kato | H03F 3/3061 330/255 |
| 2002/0180685 | A1 * | 12/2002 | Itakura et al. | 345/100 |
| 2005/0128113 | A1 * | 6/2005 | Kyung-Myun | 341/138 |
| 2007/0152948 | A1 | 7/2007 | Chen | |
| 2008/0089003 | A1 * | 4/2008 | Kojima et al. | 361/246 |
| 2008/0094381 | A1 | 4/2008 | Hiratsuka | |
| 2008/0100380 | A1 * | 5/2008 | Nishimura et al. | 330/252 |
| 2008/0204386 | A1 | 8/2008 | Park | |

FOREIGN PATENT DOCUMENTS

| | | |
|---|---|---|
| JP | 10-143116 | 5/1998 |
| JP | 10-153986 | 6/1998 |
| JP | 11-249623 | 9/1999 |
| JP | 2001-034233 | 2/2001 |
| JP | 2001-056664 | 2/2001 |
| JP | 2002-175052 | 6/2002 |
| JP | 2003-115729 | 4/2003 |
| JP | 2003-158427 | 5/2003 |
| JP | 2007-181026 | 7/2007 |

* cited by examiner

*Primary Examiner* — Quan-Zhen Wang
*Assistant Examiner* — Lin Li
(74) *Attorney, Agent, or Firm* — Robert J. Depke; The Chicago Technology Law Group, LLC

(57) ABSTRACT

A signal-line driving circuit configured to supply a signal voltage having the positive or negative polarity to each of signal lines connected to display cells arranged to form a matrix as cells each to be subjected to a polarity inversion driving operation according to inversion of the polarity of the signal voltage, the signal-line driving circuit including an output buffer section, wherein the output buffer section employs a positive-polarity operating amplifier, a negative-polarity operating amplifier, a first output buffer, a second output buffer, and a switch group.

11 Claims, 14 Drawing Sheets

TYPICAL COMPARISON CONFIGURATION

PRESENT EMBODIMENT

SIGNAL-LINE DRIVING CIRCUIT, DISPLAY DEVICE AND ELECTRONIC EQUIPMENTS

CROSS REFERENCES TO RELATED APPLICATIONS

The present invention contains subject matter related to Japanese Patent Application JP 2007-338996 filed in the Japan Patent Office on Dec. 28, 2007, the entire contents of which being incorporated herein by reference.

BACKGROUND OF THE INVENTION

1. Field of the Invention

In general, the present invention relates to a signal-line driving circuit employed in an active-matrix display device such as a liquid-crystal display device, the display device and electronic equipments each employing the display device.

2. Description of the Related Art

An image display device such as a liquid-crystal display device employs a large number of pixel circuits arranged to form a matrix as display cells and controls the light intensity of each of the display cells in accordance with information of an image to be displayed in order to display the image.

In recent years, the development of liquid-crystal display device and the growth of their performance have been becoming remarkable and it becomes possible to apply the liquid-crystal display device to electronic equipments each used for displaying a video signal input thereto or generated thereby as an image or a video in all fields. Examples of the electronic equipments are a TV set, a portable terminal such as a cellular phone or a PDA (Personal Digital Assistant), a digital camera, a notebook personal computer and a video camera.

FIG. 1 is a block diagram roughly showing the configuration of an ordinary liquid-crystal display device 1.

As shown in the block diagram of FIG. 1, the liquid-crystal display device 1 employs an available display section 2, a signal-line driving circuit 3 and a gate-line driving circuit 4. The available display section 2 includes a plurality of pixel circuits arranged on a transparent insulation substrate such as a glass substrate to form a matrix. Each of the pixel circuits has a liquid-crystal cell. Also referred to hereafter as a horizontal driving circuit HDRV or a source driver, the signal-line driving circuit 3 is a circuit for driving signal lines. On the other hand, also referred to hereafter as a vertical driving circuit VDRV or a gate driver, the gate-line driving circuit 4 is a circuit for driving vertical scan lines or gate lines.

As described above, the available display section 2 includes a plurality of pixel circuits arranged to form a matrix and each of the pixel circuits has a liquid-crystal cell not shown in the block diagram of FIG. 1.

In addition, the available display section 2 also has the signal lines driven by the signal-line driving circuit 3 and the gate lines (or the vertical scan lines) driven by the gate-line driving circuit 4. The signal lines are laid out to serve as lines each corresponding to one of the columns of the matrix whereas the gate lines (or the vertical scan lines) are laid out to serve as lines each corresponding to one of the rows of the matrix.

In order to prevent molecules of liquid crystal in the available display section 2 employed in the liquid-crystal display device from deteriorating, it is necessary to apply an AC voltage to the liquid crystal in the display device. An ordinary liquid-crystal display device adopts the so-called polarity inverting operation method of a common constant driving technique or a common inversion driving technique in order to apply the AC voltage also referred to as a common voltage to the liquid crystal.

In accordance with the common constant driving technique, a voltage appearing on a facing electrode exposed to a pixel electrode is fixed at a constant level whereas, relative to the fixed voltage appearing on the facing electrode, a voltage having a positive polarity and a voltage having a negative polarity are applied to the pixel electrode alternately.

In accordance with the common inversion driving technique, on the other hand, while the voltage appearing on the facing electrode is being inverted from a high level to a low level and vice versa, relative to the varying voltage appearing on the facing electrode, a voltage having a positive polarity and a voltage having a negative polarity are applied to the pixel electrode alternately.

To put it in detail, when the voltage appearing on the facing electrode is set at a high level, a voltage having a negative polarity relative to the high level taken as a reference is applied to the pixel electrode. When the voltage appearing on the facing electrode is set at a low level, on the other hand, a voltage having a positive polarity relative to the low level taken as a reference is applied to the pixel electrode.

An output buffer section employed in the signal-line driving circuit 3 is designed for the polarity inverting operations described above.

In order to carry out the polarity inverting operations, the signal-line driving circuit 3 makes use of a rail-to-rail output analog buffer circuit in the output buffer section as described in CMOS, Circuit Design, Layout and Simulation, P661, FIGS. 25 and 49, authored by R. Jacob, Baker Harry, W. Li and David Boyce and/or adopts a configuration utilizing an output selector having switches in the output buffer section as disclosed in Japanese Patent Laid-open No. Hei 10-153986.

FIG. 2 is a block diagram showing a typical configuration of the existing signal-line driving circuit 3 making use of the output selector.

The signal-line driving circuit 3 employs a line buffer 31, a level shifter 32, a selector section 33, a buffer amplifier section 34 and an output selector 35. The line buffer 31 is a buffer used for storing driving data obtained as a result of a parallel-into-serial conversion process as data to be used for driving signal lines. The level shifter 32 is a section for converting the level of the driving data stored in the line buffer 31 into a level according to a driving level. The selector section 33 is a section including a plurality of DACs (digital-into-analog converters) each used for converting driving data supplied by the level shifter 32 from digital data into analog data in accordance with received gradation voltages. The buffer amplifier section 34 is a section for amplifying driving data received from the selector section 33 in order to generate a signal voltage having the positive polarity and a signal voltage having the negative polarity. The output selector 35 is a section for selectively asserting a signal voltage having the positive polarity and a signal voltage having the negative polarity on every 2 adjacent signal lines respectively.

FIG. 3 is a block diagram showing a typical configuration of the buffer amplifier section 34 and the output selector 35 which are employed in the signal-line driving circuit 3 shown in the block diagram of FIG. 2.

To be more specific, FIG. 3 is a block diagram showing an analog output buffer stage included in the signal-line driving circuit 3 as a stage provided for two adjacent channels CH1 and CH2. In actuality, the number of channels of the analog output buffer stage like the one shown in the block diagram of FIG. 3 is at least 100 and signal lines corresponding to these channels are driven by making use of the driving data.

The buffer amplifier section 34 shown in the block diagram of FIG. 3 employs a first amplifier circuit 34-1 and a second amplifier circuit 34-2 which are provided for the two adjacent channels CH1 to CH2. The first amplifier circuit 34-1 is a circuit for driving a signal line SGL1 connected to the channel CH1 or a signal line SGL2 connected to the channel CH2 by supplying a signal voltage with the positive polarity to the selected signal line SGL1 or SGL2. On the other hand, the second amplifier circuit 34-2 is a circuit for driving the signal line SGL1 or the signal line SGL2 by supplying a signal voltage with the negative polarity to the selected signal line SGL1 or SGL2.

The first amplifier circuit 34-1 employs an OTA (Operational Transconductance Amplifier) 34-11 linked to a DAC of the immediately preceding stage by adoption of a cascade connection technique and an OAMP (output amplifier) 34-12.

To put it in detail, the inverting input terminal (or the (−) input terminal) of the OTA 34-11 is connected to an output line of the DAC (DAC_UPPER) whereas the non-inverting input terminal (or the (+) input terminal) of the OTA 34-11 is connected to the output line of the OAMP 34-12. The output line of the OTA 34-11 is connected to the input line of the OTA 34-12.

By the same token, the second amplifier circuit 34-2 employs an OTA (Operational Transconductance Amplifier) 34-21 linked to a DAC of the immediately preceding stage by adoption of a cascade connection technique and an OAMP (output amplifier) 34-22.

To put it in detail, the inverting input terminal (or the (−) input terminal) of the OTA 34-21 is connected to an output line of the DAC (DAC_LOWER) whereas the non-inverting input terminal (or the (+) input terminal) of the OTA 34-21 is connected to the output line of the OAMP 34-22. The output line of the OTA 34-21 is connected to the input line of the OTA 34-22.

The output selector 35 employs a first switch group 35-1 and a second switch group 35-2.

The first switch group 35-1 has a switch SW11 turned on and off in accordance with control according to a signal STR and a switch SW12 turned on and off in accordance with control according to a signal CRS. The switches SW11 and SW12 are controlled to turn on and off in a mutually complementary manner. That is to say, when the switch SW11 is controlled to turn on, the switch SW12 is controlled to turn off and vice versa.

A contact point a of the switch SW11 is connected to the output line of the OAMP 34-12 employed in the first amplifier circuit 34-1 whereas a contact point b of the switch SW11 is connected to the signal line SGL1 linked to the channel CH1.

On the other hand, while a contact point a of the switch SW12 is also connected to the output line of the OAMP 34-12 employed in the first amplifier circuit 34-1, a contact point b of the switch SW12 is connected to the signal line SGL2 linked to the channel CH2.

By the same token, the second switch group 35-2 has a switch SW21 turned on and off in accordance with control according to a signal STR and a switch SW22 turned on and off in accordance with control according to a signal CRS. The switches SW21 and SW22 are turned on and off in a mutually complementary manner. That is to say, when the switch SW21 is controlled to turn on, the switch SW22 is controlled to turn off and vice versa.

A contact point a of the switch SW21 is connected to the output line of the OAMP 34-22 employed in the second amplifier circuit 34-2 whereas a contact point b of the switch SW21 is connected to the signal line SGL2 linked to the channel CH2.

On the other hand, while a contact point a of the switch SW22 is also connected to the output line of the OAMP 34-22 employed in the second amplifier circuit 34-2, a contact point b of the switch SW22 is connected to the signal line SGL1 linked to the channel CH1.

When the switches SW11 and SW21 are controlled to turn on whereas the switches SW12 and SW22 are controlled to turn off, a positive-polarity signal voltage generated by the first amplifier circuit 34-1 is supplied to the signal line SGL1 whereas a negative-polarity signal voltage generated by the second amplifier circuit 34-2 is supplied to the signal line SGL2.

When the switches SW12 and SW22 are controlled to turn on whereas the switches SW11 and SW21 are controlled to turn off, on the other hand, the positive-polarity signal voltage generated by the first amplifier circuit 34-1 is supplied to the signal line SGL2 whereas the negative-polarity signal voltage generated by the second amplifier circuit 34-2 is supplied to the signal line SGL1.

BRIEF DESCRIPTION OF THE DRAWINGS

These and other features of the present embodiment will become clear from the following description of the preferred embodiments given with reference to the accompanying diagrams, in which.

SUMMARY OF THE INVENTION

Figure 1:
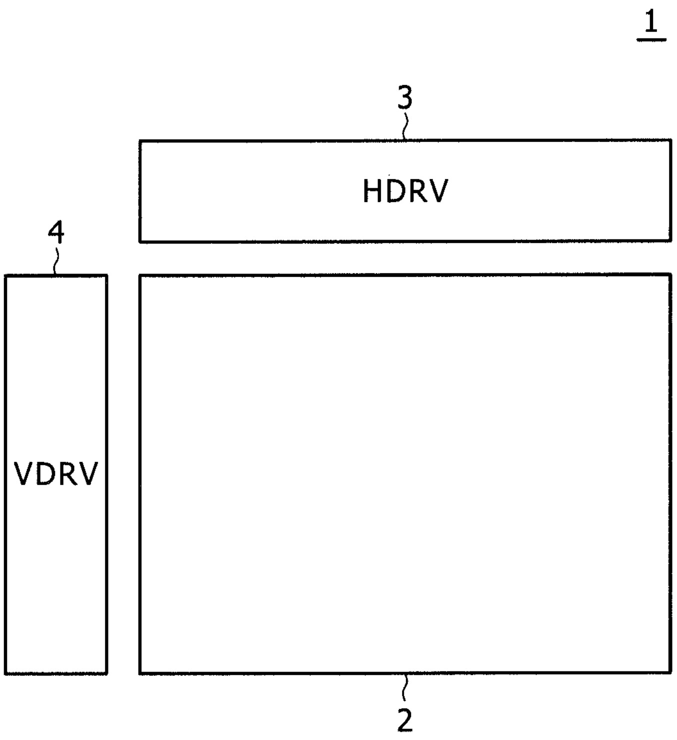
FIG. 1 (PRIOR ART)
FIG. 1 is a block diagram roughly showing the configuration of an ordinary liquid-crystal display device.
Figure 2:
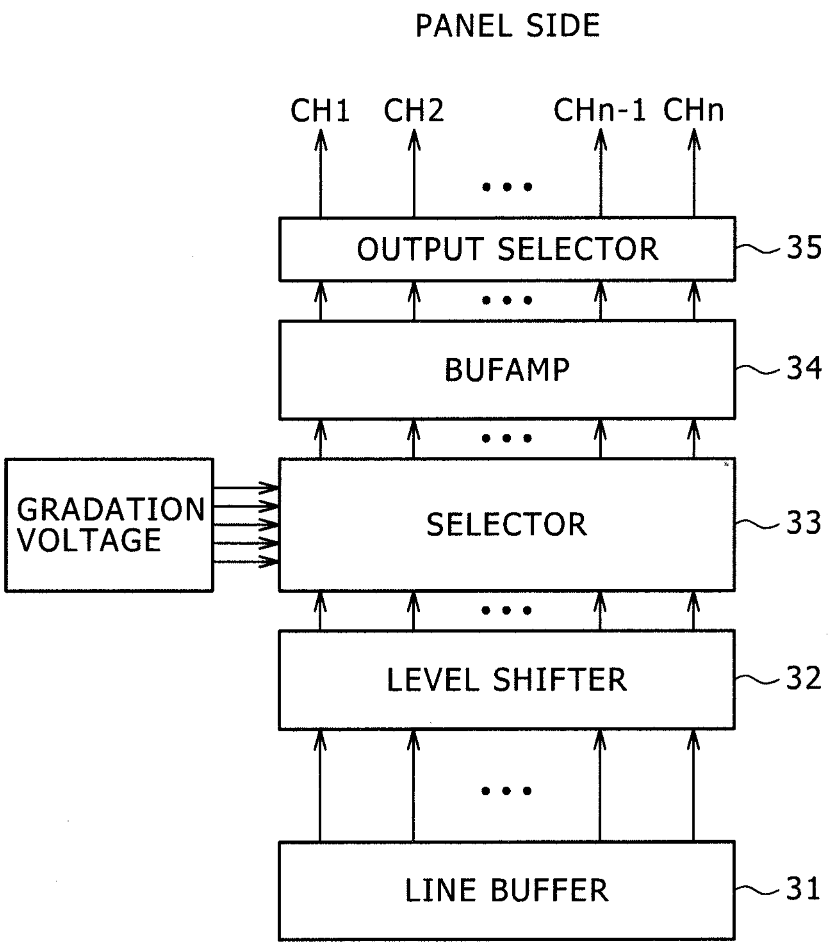
FIG. 2 (PRIOR ART)
FIG. 2 is a block diagram showing a typical configuration of the existing signal-line driving circuit making use of an output selector.
Figure 3:
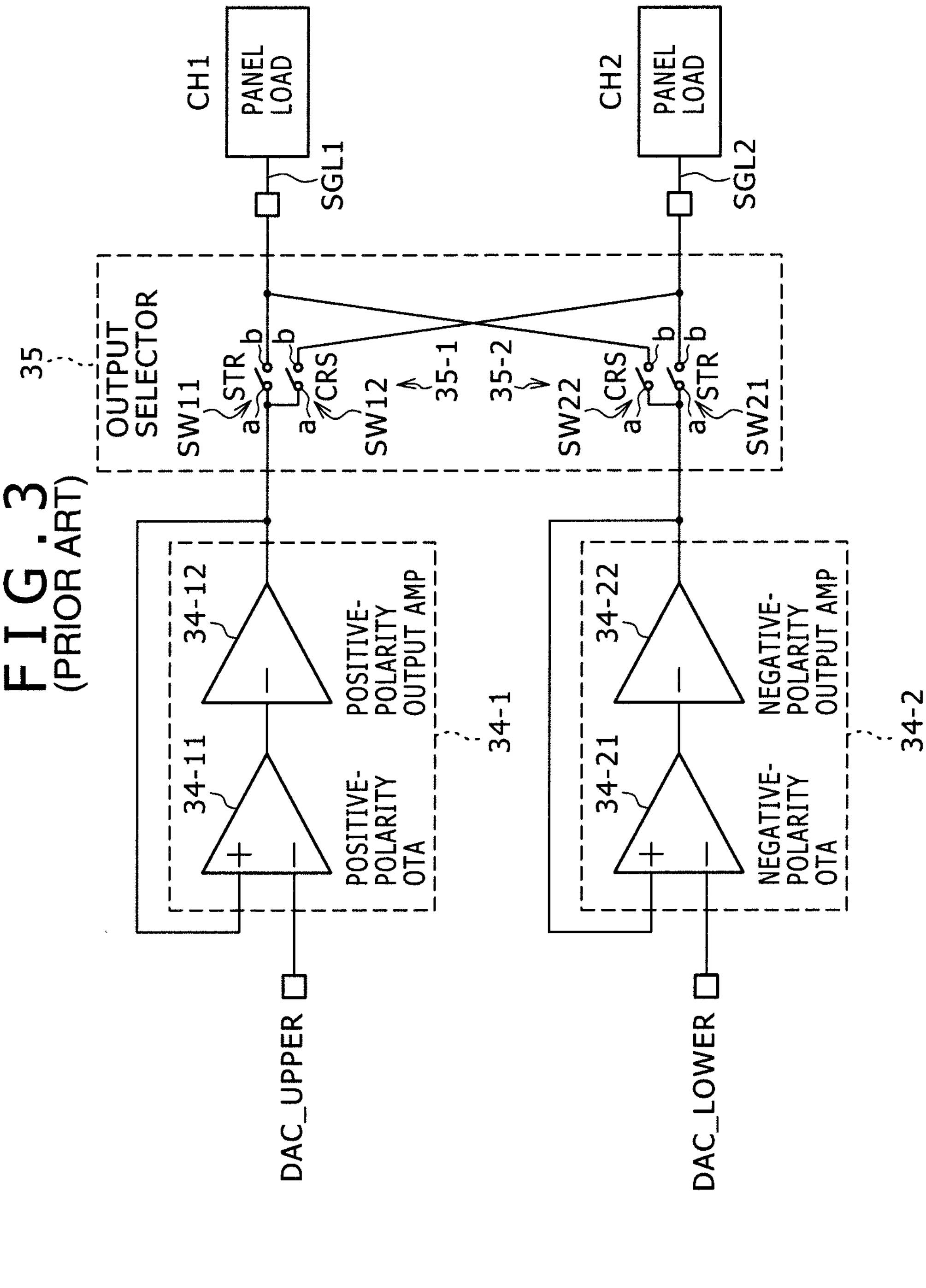
FIG. 3 (PRIOR ART)
FIG. 3 is a block diagram showing a typical configuration of a buffer amplifier section and an output selector which are employed in the signal-line driving circuit shown in the block diagram of FIG. 2.

As described above, in order to carry out polarity inverting operations, the signal-line driving circuit employed in the liquid-crystal display device makes use of a rail-to-rail output analog buffer circuit or utilizes an output selector shown in the block diagrams of FIGS. 2 and 3.

However, the rail-to-rail output analog buffer circuit raises the following problems that the circuit configuration is complex, the power consumption is high and the layout area is large.

In addition, if the output selector is used, the circuit configuration is complex even though the power consumption can be reduced. However, the output selector raises the following problems.

In order to reduce the turned-on-state resistance, the sizes of the output selector and the output stage increase. As a result, the layout area also becomes large.

In addition, a settling process worsens due the turned-on-state resistance of the output selector.

As described earlier, in actuality, the number of channels CH of the analog output buffer stage like the one shown in the block diagram of FIG. 3 is at least 100. In a number of high-definition applications of the channels CH, reduction of the layout area is strongly demanded. In addition, accompanying recent-year conversions into high-definition screens, there is raised a problem of an increasing operating frequency.

Addressing the problems described above, inventors of the present invention have innovated a signal-line driving circuit capable of preventing the circuit configuration from becoming complicated, the consumed current from increasing and the characteristics of the signal-line driving circuit from deteriorating and capable of reducing the element size (or the layout area) and innovated a display device employing the signal-line driving circuit as well as electronic equipments each employing the display device.

In order to achieve the need to realize the innovations described above, in accordance with a first embodiment of the present invention, there is provided a signal-line driving circuit configured to supply a signal voltage having the positive or negative polarity to each of signal lines connected to display cells arranged to form a matrix as cells each to be subjected to a polarity inversion driving operation according to inversion of the polarity of said signal voltage. The signal-line driving circuit employs an output buffer section configured to amplify input data, which is used for driving said signal lines, in order to generate a signal voltage having said positive polarity as well as a signal voltage having said negative polarity and selectively supplying said signal voltage having said positive polarity and said signal voltage having said negative polarity to a pair of first and second ones of said signal lines. The output buffer section employs a positive-polarity operating amplifier configured to amplify said input data in order to generate said signal voltage having said positive polarity, a negative-polarity operating amplifier configured to amplify said input data in order to generate said signal voltage having said negative polarity, and a first output buffer configured to supply a signal voltage having said positive polarity or a signal voltage having said negative polarity to said first signal line. The output buffer section further employs a second output buffer configured to supply a signal voltage having said positive polarity or a signal voltage having said negative polarity to said second signal line, and a switch group including switches placed between the output of said positive-polarity operating amplifier and the input of said first output buffer, and between the output of said negative-polarity operating amplifier and the input of said second output buffer. The switch group further includes switch placed at the feedback input stage of said positive-polarity operating amplifier, and at the feedback input stage of said negative-polarity operating amplifier There are no switches placed between the output of said first output buffer and said first signal line and between the output of said second output buffer and said second signal line.

It is preferable to operate the switch group as follows. In a first mode, the switch group supplies a signal voltage generated by the positive-polarity operating amplifier having the positive polarity to the first output buffer, feeds a signal output by the first output buffer back to the positive-polarity operating amplifier, supplies a signal voltage generated by the negative-polarity operating amplifier having the negative polarity to the second output buffer and feeds a signal output by the second output buffer back to the negative-polarity operating amplifier. In a second mode, on the other hand, the switch group supplies a signal voltage generated by the positive-polarity operating amplifier having the positive polarity to the second output buffer, feeds a signal output by the second output buffer back to the positive-polarity operating amplifier, supplies a signal voltage generated by the negative-polarity operating amplifier having the negative polarity to the first output buffer and feeds a signal output by the first output buffer back to the negative-polarity operating amplifier.

In a preferred configuration, the positive-polarity operating amplifier has a differential amplifier including a pair of first-conduction transistors while the negative-polarity operating amplifier has a differential amplifier including a pair of second-conduction transistors and each of the first and second output buffers has an AB-class push-pull operation function.

In another preferred configuration, each of the first and second output buffers has two input terminals.

In accordance with a second embodiment of the present invention, there is provided a display device employing a display section having display cells arranged to form a matrix as cells each to be subjected to a polarity inversion driving operation, and a signal-line driving circuit configured to supply said signal voltage having the positive or negative polarity to each of signal lines connected to said display cells in said polarity inversion driving operation. The signal-line driving circuit employs an output buffer section configured to amplify input data, which is used for driving said signal lines, in order to generate a signal voltage having said positive polarity as well as a signal voltage having said negative polarity and selectively supplying said signal voltage having said positive polarity and said signal voltage having said negative polarity to a pair of first and second ones of said signal lines. The output buffer section employs a positive-polarity operating amplifier configured to amplify said input data in order to generate said signal voltage having said positive polarity, a negative-polarity operating amplifier configured to amplify said input data in order to generate said signal voltage having said negative polarity, and a first output buffer configured to supply a signal voltage having said positive polarity or a signal voltage having said negative polarity to said first signal line. The output buffer section further employs a second output buffer configured to supply a signal voltage having said positive polarity or a signal voltage having said negative polarity to said second signal line, and a switch group including switches placed between the output of said positive-polarity operating amplifier and the input of said first output buffer, and between the output of said negative-polarity operating amplifier and the input of said second output buffer. The switch group further includes switches placed at the feedback input stage of said positive-polarity operating amplifier, and at the feedback input stage of said negative-polarity operating amplifier. There are no switches placed between the output of said first output buffer and said first signal line and between the output of said second output buffer and said second signal line.

In accordance with a third embodiment of the present invention, there is provided an electronic equipment including a display device employing a display section having display cells arranged to form a matrix as cells each to be subjected to a polarity inversion driving operation, and a signal-line driving circuit configured to supply said signal voltage having the positive or negative polarity to each of signal lines connected to said display cells in said polarity inversion driving operation. The signal-line driving circuit employs an output buffer section configured to amplify input data, which is used for driving said signal lines, in order to generate a signal voltage having said positive polarity as well as a signal voltage having said negative polarity and selectively supplying said signal voltage having said positive polarity and said signal voltage having said negative polarity to a pair of first and second ones of said signal lines. The output buffer section employs a positive-polarity operating amplifier configured to amplify said input data in order to generate said signal voltage having said positive polarity, a negative-polarity operating amplifier configured to amplify said input data in order to generate said signal voltage having said negative polarity, and a first output buffer configured to supply a signal voltage having said positive polarity or a signal voltage having said negative polarity to said first signal line. The output further section further employs a second output buffer configured to supply a signal voltage having said positive polarity or a signal voltage having said negative polarity to said second signal line, and a switch group including switches placed between the output of said positive-polarity operating amplifier and the input of said first output buffer, and between the output of said negative-polarity operating amplifier and the input of said second output buffer. The switch group further includes switches placed at the feedback input stage of said positive-polarity operating amplifier, and at the feedback input stage of said negative-polarity operating amplifier. There are no switches placed between the output of said first output buffer and said first signal line and between the output of said second output buffer and said second signal line.

In accordance with the present embodiment, for example, in the first mode, a signal voltage generated by the positive-polarity operating amplifier as a signal voltage having the positive polarity is supplied to a first signal line by way of the first output buffer and a signal voltage generated by the negative-polarity operating amplifier as a signal voltage having the negative polarity is supplied to a second signal line by way of the second output buffer.

In the second mode, on the other hand, a signal voltage generated by the positive-polarity operating amplifier as a signal voltage having the positive polarity is supplied to the second signal line by way of the second output buffer and a signal voltage generated by the negative-polarity operating amplifier as a signal voltage having the negative polarity is supplied to the first signal line by way of the first output buffer.

In accordance with the present embodiment, it is possible to prevent the circuit configuration from becoming complicated, the consumed current from increasing and the characteristics of the output buffer section from deteriorating and, hence, possible to reduce the element size (or the layout area).

In addition, since the present embodiment also exhibits an effect of cancelling an offset of the output-stage amplifier, the present embodiment contributes to improvement of the picture quality.

DETAILED DESCRIPTION OF THE PREFERRED EMBODIMENT

A preferred embodiment of the invention is explained in detail by referring to diagrams as follows.

Figure 4:
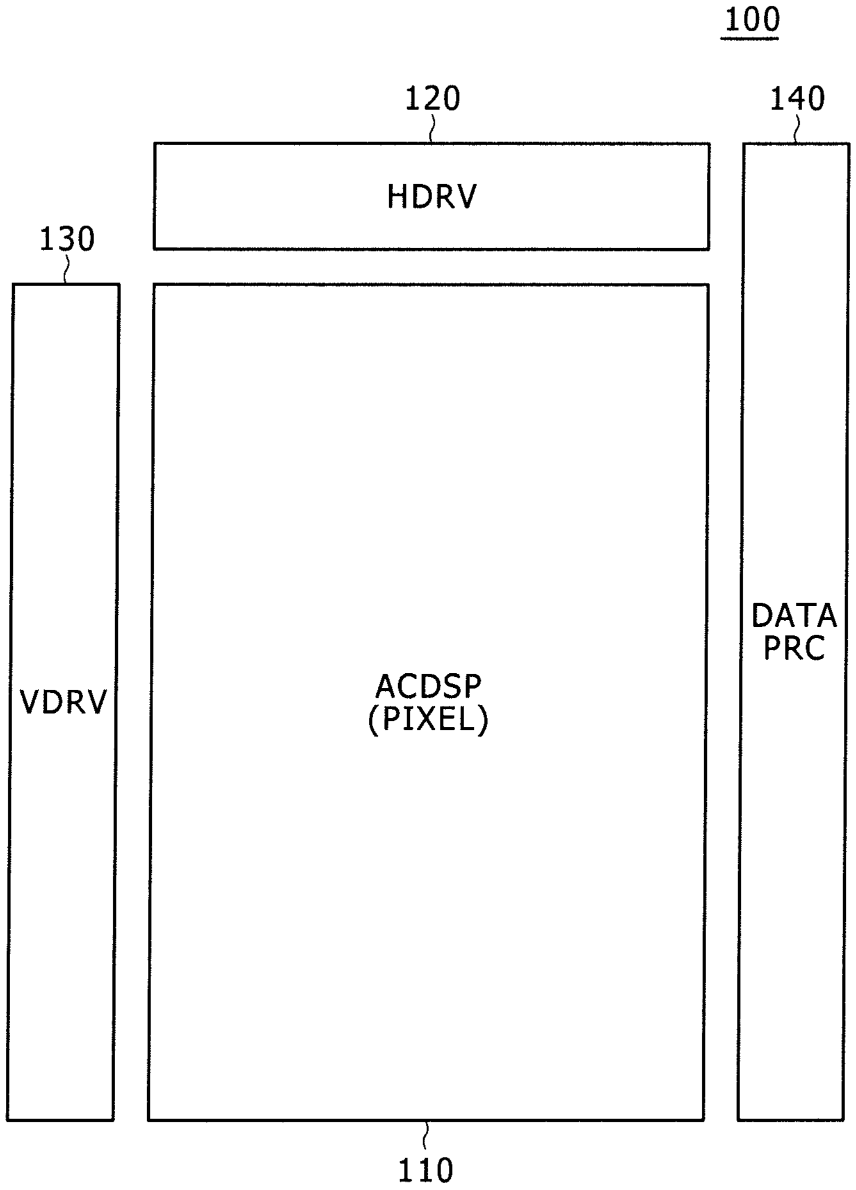
FIG. 4 is a block diagram showing a typical configuration of a liquid-crystal display device according to an embodiment of the present invention.

FIG. 4 is a block diagram showing a typical configuration of a liquid-crystal display device 100 according to an embodiment of the present invention.

In this case, as an example, the embodiment implements an active-matrix liquid-crystal display device 100 employing liquid-crystal cells each functioning as the electro optical element of every pixel circuit of the active-matrix liquid-crystal display device 100.

As shown in the block diagram of FIG. 4, the active-matrix liquid-crystal display device 100 employs an available display section (ACDSP) 110, a signal-line driving circuit 120, a gate-line driving circuit 130 and a data processing circuit (DATAPRC) 140. The available display section 110 includes a plurality of pixel circuits arranged on a transparent insulation substrate such as a glass substrate to form a matrix. As described above, each of the pixel circuits has a liquid-crystal cell. Also referred to hereafter as a horizontal driving circuit (HDRV) or a source driver, the signal-line driving circuit 120 is a circuit for driving signal lines. On the other hand, also referred to hereafter as a vertical driving circuit (VDRV) or a gate driver, the gate-line driving circuit 130 is a circuit for driving vertical scan lines or gate lines.

The following description sequentially explains the configuration and function of every configuration component employed in the active-matrix liquid-crystal display device 100 according to the embodiment.

As described above, the available display section 110 also referred to hereafter simply as a display section 110 includes a plurality of pixel circuits arranged on a transparent insulation substrate such as a glass substrate to form a matrix.

In addition, the available display section 110 also has the signal lines driven by the signal-line driving circuit 120 and the gate lines (or the vertical scan lines) driven by the gate-line driving circuit 130. The signal lines are laid out to serve as lines each corresponding to one of the columns of the matrix whereas the gate lines (or the vertical scan lines) are laid out to serve as lines each corresponding to one of the rows of the matrix.

Figure 5:
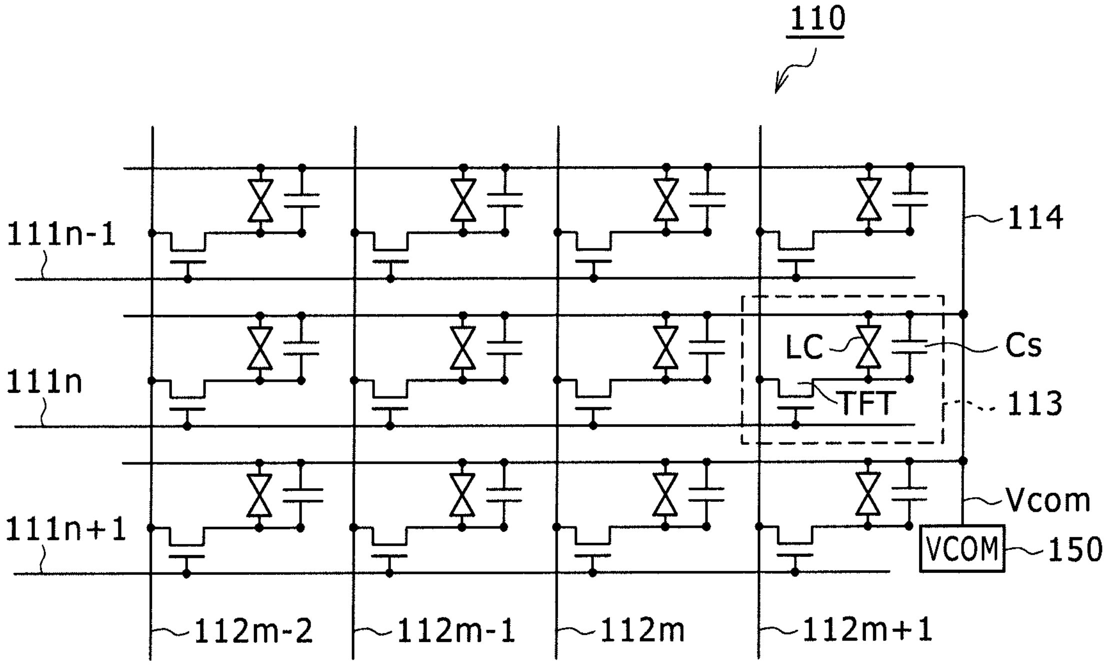
FIG. 5 is a circuit diagram showing a typical concrete configuration of an available display section of the liquid-crystal display device.

FIG. 5 is a circuit diagram showing a typical concrete configuration of the available display section 110.

In order to make the diagram simple, the typical matrix of the available display section 110 shown in the diagram consists of three rows, i.e., the (n−1)th to (n+1)th rows, and four columns, i.e., the (m−2)th to (m+1)th columns.

In the available display section 110 shown in the circuit diagram of FIG. 5, gate lines (or vertical scan lines) $\mathbf{111}_{n-1}$, $\mathbf{111}_{n}$ and $\mathbf{111}_{n+1}$ are laid out to serve as lines each corresponding to one of the rows of the matrix whereas signal lines (or data lines) $\mathbf{112}_{m-2}$, $\mathbf{112}_{m-1}$, $\mathbf{112}_{m}$ and $\mathbf{112}_{m+1}$ are laid out to serve as lines each corresponding to one of the columns of the matrix. A unit pixel circuit 113 is laied out at intersection portions of these ilnes.

A unit pixel circuit 113 is configured to include a TFT (Thin Film Transistor) serving as a pixel transistor, a liquid-crystal cell LC and a signal storage capacitor Cs.

The liquid-crystal cell LC is actually a capacitor created between a pixel electrode and an other electrode facing the pixel electrode. The pixel electrode is an electrode connected to the drain electrode of the thin-film transistor TFT. Facing the pixel electrode, the other electrode is also referred to as a facing electrode.

The gate electrode of the thin-film transistor TFT is connected to a gate line (also referred to as a vertical scan line), that is, one of gate lines . . . , $\mathbf{111}_{n-1}$, $\mathbf{111}_{n}$, $\mathbf{111}_{n+1}$, . . . . The source electrode of the thin-film transistor TFT is connected to a signal line (also referred to as a data line), that is, one of signal lines . . . , $\mathbf{112}_{m-2}$, $\mathbf{112}_{m-1}$, $\mathbf{112}_{m}$, $\mathbf{112}_{m+1}$, . . . .

The pixel electrode of the liquid-crystal cell LC is connected to the drain electrode of the thin-film transistor TFT as described above whereas the facing electrode of the liquid-crystal cell LC is connected to a common line 114. The storage capacitor Cs is connected between the drain electrode of the thin film transistor and the common line 114.

A common-voltage supply circuit (VCOM circuit) 150 asserts an AC voltage determined in advance on the common line 114 as a common voltage Vcom.

One end of any particular one of the gate lines (or vertical scan lines) . . . , $\mathbf{111}_{n-1}$, $\mathbf{111}_{n}$, $\mathbf{111}_{n+1}$, . . . . of the available display section 110 is connected an output terminal employed in the gate-line driving circuit 130 included in the active-matrix liquid-crystal display device 100 as shown in the block diagram of FIG. 4 as a terminal for a row corresponding to the particular gate line.

The gate-line driving circuit 130 has a configuration for example including a shift register for sequentially outputting a gate-line select pulse in synchronization with a vertical transfer clock signal VCK not shown in the circuit diagram of FIG. 5 to the gate lines (or vertical scan lines) . . . , $\mathbf{111}_{n-1}$, $\mathbf{111}_{n}$, $\mathbf{111}_{n+1}$, . . . .

One end of any particular one of the signal lines (or the data lines) . . . , $\mathbf{112}_{m-2}$, $\mathbf{112}_{m-1}$, $\mathbf{112}_{m}$, $\mathbf{112}_{m+1}$, . . . . of the available display section 110 is connected an output terminal employed in the signal-line driving circuit 120 included in the active-matrix liquid-crystal display device 100 as shown in the block diagram of FIG. 4 as a terminal for a column corresponding to the particular signal line 112.

The signal-line driving circuit 120 has a function to convert driving data from digital data into analog data and amplify the analog data in accordance with a gradation voltage in order to generate a signal voltage having the positive polarity as well as a signal voltage having the negative polarity from the amplified analog data. The level of the driving data processed in this way is converted into a driving level used for driving a signal line 112. In addition, the signal-line driving circuit 120 also has a function to selectively supply the signal voltage having the positive polarity and the signal voltage having the negative polarity to respectively two signal lines 112 adjacent to each other.

The data processing circuit 140 employed in the active-matrix liquid-crystal display device 100 as shown in the block diagram of FIG. 4 has a level shifter and a serial-into-parallel converter. The level shifter is a section for shifting the level of parallel data received from an external source to a level determined in advance. In order to adjust the phase of data output by the level shifter and lower the frequency of the data, the serial-into-parallel converter carries out a process of conversion from serial data into parallel data. The serial-into-parallel converter outputs the parallel data to the signal-line driving circuit 120.

The following description concretely explains the configuration and function of the signal-line driving circuit 120 according to the embodiment.

Figure 6:
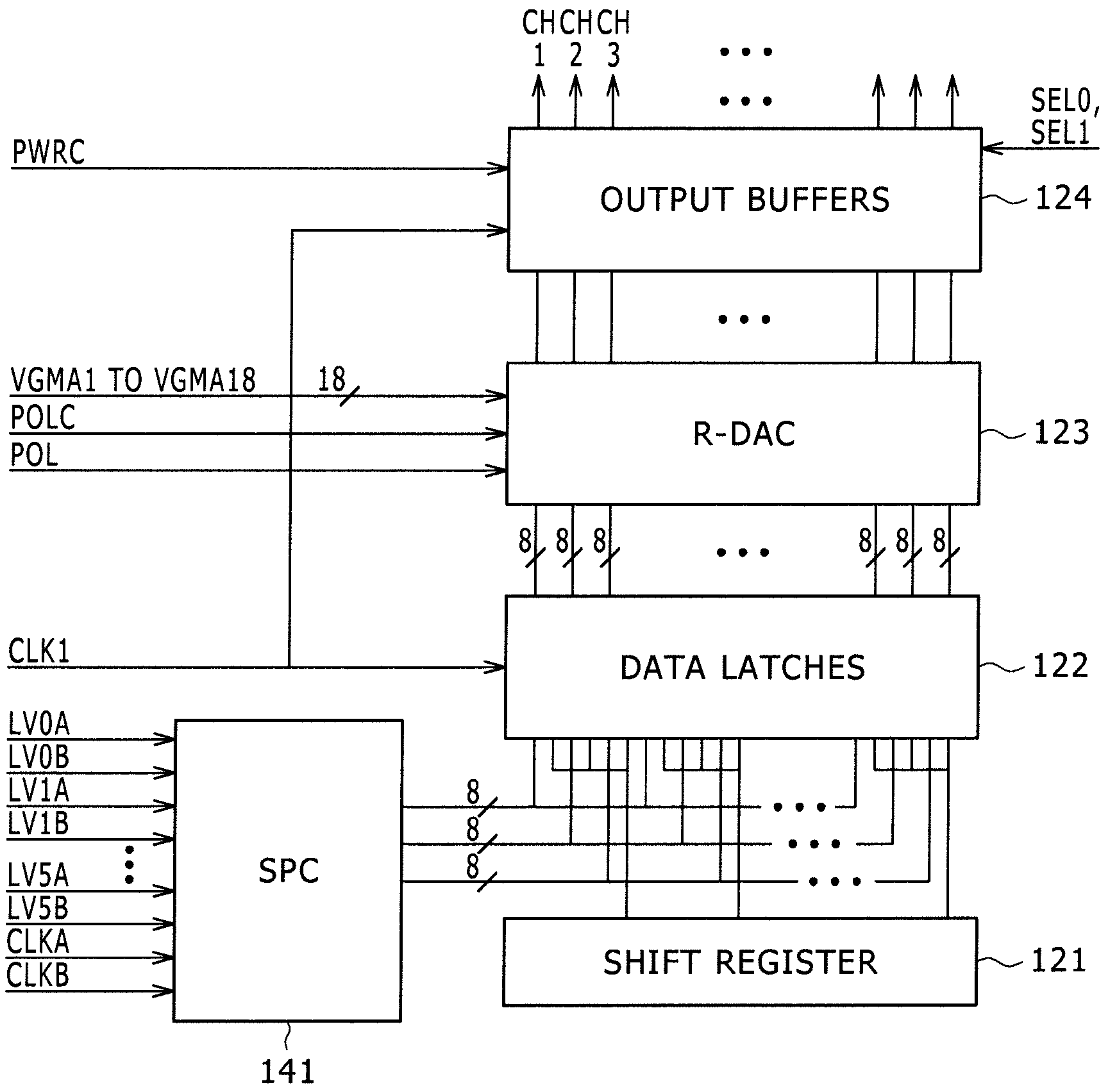
FIG. 6 is a block diagram showing a typical configuration of a signal-line driving circuit employed in the liquid-crystal display device according to the embodiment.

FIG. 6 is a block diagram showing a typical configuration of the signal-line driving circuit 120 according to the embodiment.

The signal-line driving circuit 120 shown in the block diagram of FIG. 6 employs a shift register 121, a data latch section 122, a DAC (digital-into-analog converter) 123 and an output buffer section 124.

It is to be noted that an SPC (Serial-into-Parallel Converter) denoted by reference numeral 141 in the block diagram of FIG. 6 is the serial-into-parallel converter described above as the serial-into-parallel converter included in the data processing circuit 140.

The shift register 121 is a component for sequentially supplying a shift pulse (or a sampling pulse) from its transfer stages each corresponding to a column of the pixel matrix to the data latch section 122 in synchronization with a horizontal transfer clock signal HCK not shown in the block diagram of FIG. 6.

The data latch section 122 is a component for sequentially sampling digital driving data received from the serial-into-parallel converter 141 as data to be used for driving the signal lines 112 in synchronization with the sampling pulse received from the shift register 121.

The DAC 123 is a component for receiving a gradation voltage and converting digital driving data received from the data latch section 122 into analog driving data.

The output buffer section 124 is a component for amplifying analog driving data received from the DAC 123 in order to generate a signal voltage having the positive polarity as well as a signal voltage having the negative polarity and selectively supplying the signal voltage having the positive polarity and the signal voltage having the negative polarity respectively to a pair of first and second ones of the signal lines 112 which are adjacent to each other.

Figure 7:
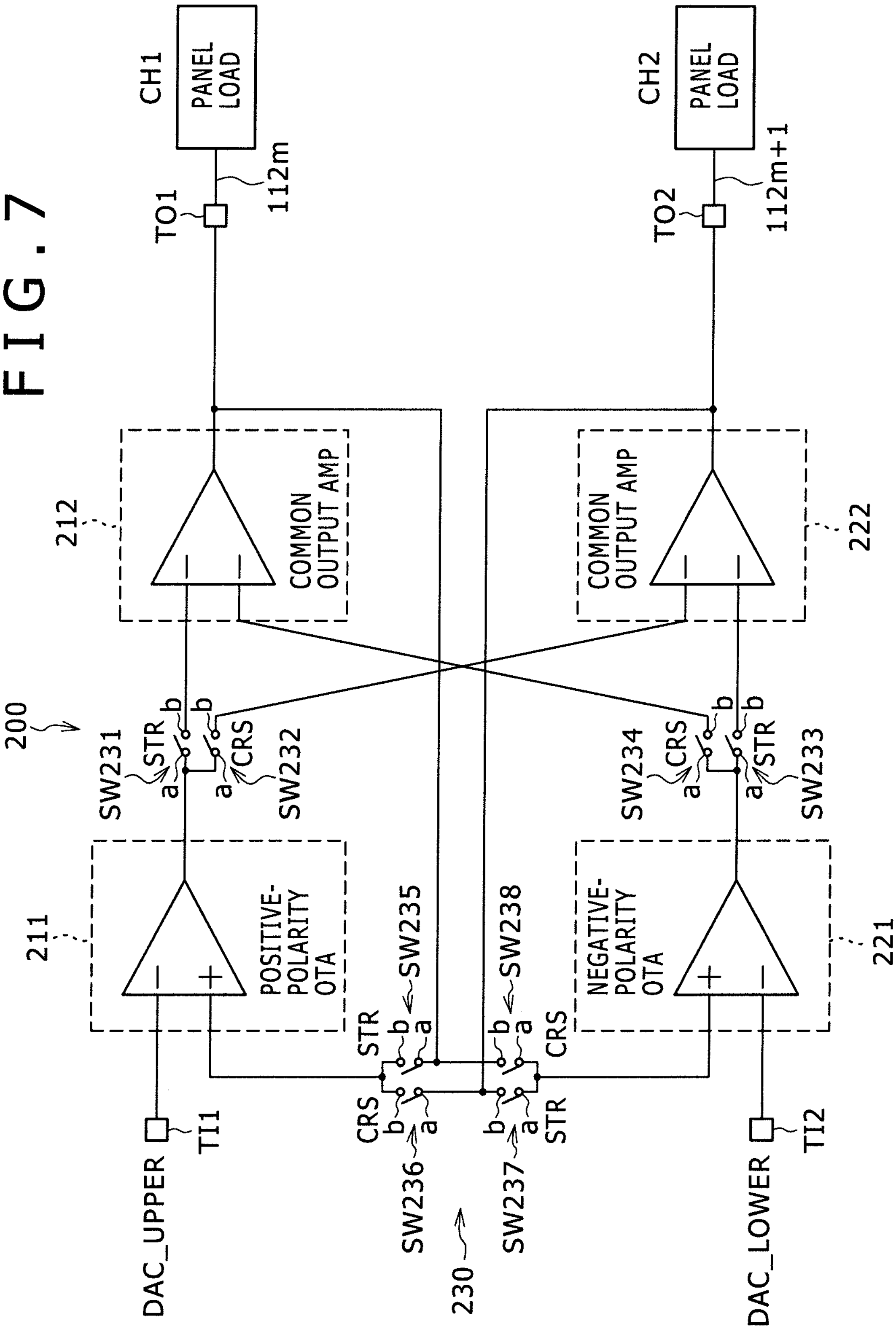
FIG. 7 is a block diagram showing a typical configuration of an output buffer section employed in the signal-line driving circuit according to the embodiment.

FIG. 7 is a block diagram showing a typical configuration of the output buffer section 124 employed in the signal-line driving circuit 120 according to the embodiment.

In the following description, the output buffer section 124 is denoted by reference numeral 200.

The output buffer section 200 shown in the block diagram of FIG. 7 employs a positive-polarity OTA (Operational Transconductance Amplifier) 211, a first common output amplifier (OAMP) 212, a negative-polarity OTA 221, a second OAMP 222 and a switch group 230 including a first switch SW231 to an eighth switch SW238. The positive-polarity OTA 211 is a component connected to an output of the DAC 123 (DAC_UPPER) provided at the immediately preceding stage as a component having a function of amplifying input data from the DAC 123 in order to generate a signal voltage with the positive polarity. The first common OAMP 212 is a component provided with an output buffer function as a component for supplying a signal voltage with the positive or negative polarity to a first signal line $\mathbf{112}_m$ connected to channel $CH_m$ where notation m denotes an integer having a typical value of 1 in this case for example. The negative-polarity OTA 221 is a component connected to an output of the DAC 123 (DAC_LOWER) as a component having a function of amplifying input data from the DAC 123 in order to generate a signal voltage with the negative polarity. The second common OAMP 222 is a component provided with an output buffer function as a component for supplying a signal voltage with the positive or negative polarity to a second signal line $\mathbf{112}_{m+1}$ connected to channel $CH_{m+1}$. For m=1, channel $CH_m$ is channel 1 whereas channel $CH_{m+1}$ is channel 2. The first switch SW231 is a switch connected between the output terminal of the positive-polarity OTA 211 and a first input terminal of the first common OAMP 212. The second switch SW232 is a switch connected between the output terminal of the positive-polarity OTA 211 and a first input terminal of the second common OAMP 222. The third switch SW233 is a switch connected between the output terminal of the negative-polarity OTA 221 and a second input terminal of the second common OAMP 222. The fourth switch SW234 is a switch connected between the output terminal of the negative-polarity OTA 221 and a second input terminal of the first common OAMP 212. The fifth switch SW235 is a switch connected between the output terminal of the first common OAMP 212 and the non-inverting (+) input terminal of the positive-polarity OTA 211. The sixth switch SW236 is a switch connected between the output terminal of the second common OAMP 222 and the non-inverting (+) input terminal of the positive-polarity OTA 211. The seventh switch SW237 is a switch connected between the output terminal of the second common OAMP 222 and the non-inverting (+) input terminal of the negative-polarity OTA 221. The eighth switch SW238 is a switch connected between the output terminal of the first common OAMP 212 and the non-inverting (+) input terminal of the negative-polarity OTA 221.

A signal output by the positive-polarity OTA 211 is supplied to the first input terminal of the first common OAMP 212 by way of the first switch SW231 and the first input terminal of the second common OAMP 222 by way of the second switch SW232.

A signal output by the negative-polarity OTA 221 is supplied the second input terminal of the second common OAMP 222 by way of the third switch SW233 and to the second input terminal of the first common OAMP 212 by way of the fourth switch SW234.

The inverting (−) input terminal of the positive-polarity OTA 211 is connected to an input terminal TI1 to which an output line (DAC_UPPER) of the DAC 123 provided at the immediately preceding stage is tied. The non-inverting (+) input terminal of the positive-polarity OTA 211 is connected to the output terminal of the first common OAMP 212 through the fifth switch SW235 and connected to the output terminal of the second common OAMP 222 through the sixth switch SW236.

The inverting (−) input terminal of the negative-polarity OTA 221 is connected to an input terminal TI2 to which an output line (DAC_LOWER) of the DAC 123 provided at the immediately preceding stage is tied. The non-inverting (+) input terminal of the negative-polarity OTA 221 is connected to the output terminal of the second common OAMP 222 through the seventh switch SW237 and connected to the output terminal of the first common OAMP 212 through the eighth switch SW238.

The output terminal of the first common OAMP 212 is connected to an output terminal TO1 to which a first signal line $\mathbf{112}_m$ of channel 1 for m=1 is tied.

The output terminal of the second common OAMP 222 is connected to an output terminal TO2 to which a second signal line $\mathbf{112}_{m+1}$ of channel 2 for m=1 is tied.

The switch group 230 is divided into first and second switch groups. The first switch group consists of the first switch SW231, the third switch SW233, the fifth switch SW235 and the seventh switch SW237 which are each controlled by a common signal STR to turn on and off.

On the other hand, the second switch group consists of the second switch SW232, the fourth switch SW234, the sixth switch SW236 and the eighth switch SW238 which are each controlled by an other common signal CRS to turn on and off.

The first switch SW231, the third switch SW233, the fifth switch SW235 and the seventh switch SW237 which pertain to the first switch group are controlled to turn on and off complementarily to the second switch SW232, the fourth switch SW234, the sixth switch SW236 and the eighth switch SW238 which pertain to the second switch group.

That is to say, a control system not shown in the block diagram of FIG. 7 controls the common signals STR and CRS in such a way that, when the common signal STR is at a high level, the other common signal CSR is set at a low level but, when the common signal STR is at a low level, the other common signal CSR is set at a high level.

For example, the first switch SW231, the third switch SW233, the fifth switch SW235 and the seventh switch SW237 which pertain to the first switch group are each controlled to turn on by setting the common signal STR to a high level or turn off by setting the common signal STR to a low level.

By the same token, the second switch SW232, the fourth switch SW234, the sixth switch SW236 and the eighth switch SW238 which pertain to the second switch group are each controlled to turn on by setting the other common signal CRS to a high level or turn off by setting the other common signal CRS to a low level.

It is to be noted that, in this embodiment, control to turn on the common signals STR and CRS at the same time is prohibited.

In this embodiment, a state in which the common signal STR is at a high level and the common signal CRS is at a low level is referred to as a first mode whereas a state in which the common signal CRS is at a high level and the common signal STR is at a low level is referred to as a second mode which is a disjunction mode of the first mode.

A terminal a of the first switch SW231 is connected to the output terminal of the positive-polarity OTA 211 whereas a terminal b of the first switch SW231 is connected to the first input terminal of the first common OAMP 212.

A terminal a of the second switch SW232 is connected to the output terminal of the positive-polarity OTA 211 whereas a terminal b of the second switch SW232 is connected to the first input terminal of the second common OAMP 222.

A terminal a of the third switch SW233 is connected to the output terminal of the negative-polarity OTA 221 whereas a terminal b of the third switch SW233 is connected to the second input terminal of the second common OAMP 222.

A terminal a of the fourth switch SW234 is connected to the output terminal of the negative-polarity OTA 221 whereas a terminal b of the fourth switch SW234 is connected to the second input terminal of the first common OAMP 212.

A terminal a of the fifth switch SW235 is connected to the output terminal of the first common OAMP 212 whereas a terminal b of the fifth switch SW235 is connected to the non-inverting (+) input terminal of the positive-polarity OTA 211.

A terminal a of the sixth switch SW236 is connected to the output terminal of the second common OAMP 222 whereas a terminal b of the sixth switch SW236 is connected to the non-inverting (+) input terminal of the positive-polarity OTA 211.

A terminal a of the seventh switch SW237 is connected to the non-inverting (+) terminal of the negative-polarity OTA 221 whereas a terminal b of the seventh switch SW237 is connected to the output terminal of the second common OAMP 222.

A terminal a of the eighth switch SW238 is connected to the non-inverting (+) terminal of the negative-polarity OTA 221 whereas a terminal b of the eighth switch SW238 is connected to the output terminal of the first common OAMP 212.

Figure 8:
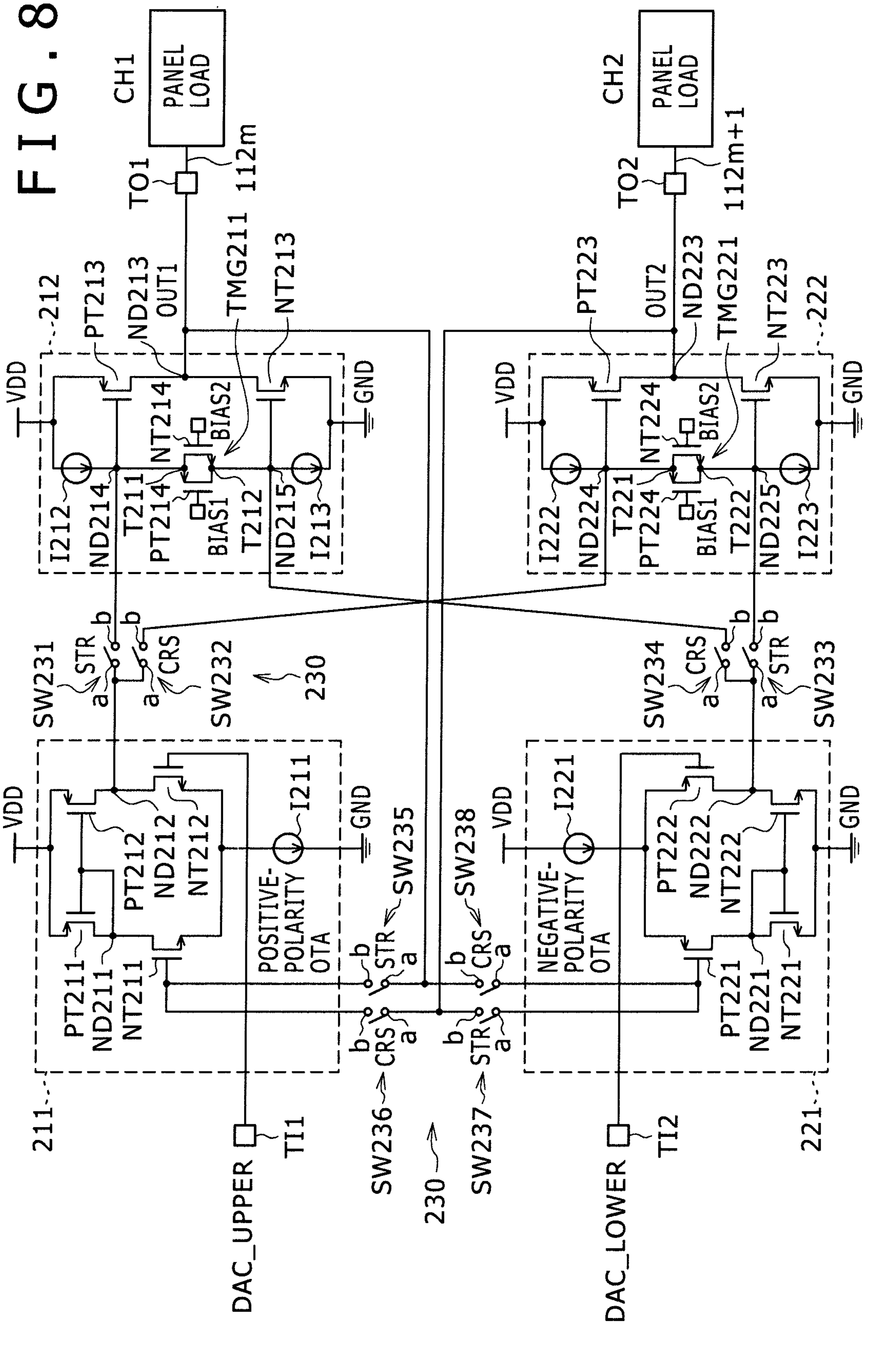
FIG. 8 is a circuit diagram showing a more concrete typical configuration of the output buffer section shown in the block diagram of FIG. 7.

FIG. 8 is a circuit diagram showing a more concrete typical configuration of the output buffer section 200 shown in the block diagram of FIG. 7.

The positive-polarity OTA 211 employs PMOS (p-channel MOS) transistors PT211 and PT212 each serving as a transistor of a first conduction type, NMOS (n-channel MOS) transistors NT211 and NT212 each serving as a transistor of a second conduction type as well as a current source I211.

The source electrode of the PMOS transistor PT211 and the source electrode of the PMOS transistor PT212 are connected to a connection point wired to a power-supply electric potential Vdd.

The drain electrode of the PMOS transistor PT211 and the drain electrode of the NMOS transistor NT211 are connected to a connection point serving as a node ND211. The drain and gate electrodes of the PMOS transistor PT211 are connected to a connection point wired to the gate electrode of the PMOS transistor PT212. That is to say, the node ND211 is connected to the gate electrode of the PMOS transistor PT211 and the gate electrode of the PMOS transistor PT212.

The drain electrode of the PMOS transistor PT212 and the drain electrode of the NMOS transistor NT212 are connected to a connection point serving as an output node ND212 which is also the output terminal of the positive-polarity OTA 211.

The source electrode of the NMOS transistor NT211 and the source electrode of the NMOS transistor NT212 are connected to a connection point wired to the drain terminal of the current source I211.

The gate electrode of the NMOS transistor NT211 serves as the non-inverting (+) of the positive-polarity OTA 211 whereas the gate electrode of the NMOS transistor NT212 serves as the inverting (−) of the positive-polarity OTA 211.

Since the non-inverting (+) of the positive-polarity OTA 211 is connected to the terminal b of the fifth switch SW235 and the terminal b of the sixth switch SW236, the gate electrode of the NMOS transistor NT211 is also connected to the terminals b of the fifth switch SW235 and the sixth switch SW236. Since the inverting (−) of the positive-polarity OTA 211 is connected to an input terminal TI1 wired to an output terminal (DAC_UPPER) of the DAC 123, the gate electrode of the NMOS transistor NT212 is also connected to the input terminal TI1.

The output node ND212 of the positive-polarity OTA 211 is connected to the terminal a of the first switch SW231 and the terminal a of the second switch SW232.

A differential amplifier including the NMOS transistor NT211 and the NMOS transistor NT212 in the positive-polarity OTA 211 having such a configuration amplifies the difference between a signal output by the DAC 123 (DAC_UPPER) and a signal output by the first common OAMP 212 or the second common OAMP 222 and outputs a data signal obtained as a result of the amplification to the first input terminal of the first common OAMP 212 by way of the first switch SW231 or the first input terminal of the second common OAMP 222 by way of the second switch SW232.

The first common OAMP 212 employs a PMOS transistor PT213, an NMOS transistor NT213, current sources I212 and I213 as well as a transfer gate TMG211. The transfer gate TMG211 employs a PMOS transistor PT214 and an NMOS transistor NT214 by connecting the source electrode of the PMOS transistor PT214 to the drain electrode of the NMOS transistor NT214 and connecting the drain electrode of the PMOS transistor PT214 to the source electrode of the NMOS transistor NT214.

The source electrode of the PMOS transistor PT213 is connected to the power-supply electric potential Vdd whereas the drain electrode of the PMOS transistor PT213 and the drain electrode of the NMOS transistor NT213 are connected to a connection point serving as an output node ND213 which is the output terminal of the first common OAMP 212. The source electrode of the NMOS transistor NT213 is connected to a ground electric potential GND.

The drain terminal of the current source I212 is connected to the power-supply electric potential Vdd. The source terminal of the current source I212, the gate electrode of the PMOS transistor PT213 and an input/output terminal T211 of the transfer gate TMG211 are connected to a connection point serving as an input node ND214 which is the first input terminal of the first common OAMP 212.

The source terminal of the current source I213 is connected to the ground electric potential GND. The drain terminal of the current source I213, the gate electrode of the NMOS transistor NT213 and an input/output terminal T212 of the transfer gate TMG211 are connected to a connection point serving as an input node ND215 which is the second input terminal of the first common OAMP 212.

A first bias signal BIAS1 is supplied to the gate electrode of the PMOS transistor PT214 employed in the transfer gate TMG211 whereas a second bias signal BIAS2 is supplied to the gate electrode of the NMOS transistor NT214 employed in the transfer gate TMG211. The first and second bias signals BIAS1 and BIAS2 are applied to the gate electrodes as voltages used for setting a DC current flowing to the first common OAMP 212 provided at the output stage.

The output node ND213 of the first common OAMP 212 is connected to an output terminal TO1 for channel CH1. The input node ND214 of the first common OAMP 212 is connected to the terminal b of the first switch SW231 whereas the input node ND215 of the first common OAMP 212 is connected to the terminal b of the fourth switch SW234.

The first common OAMP 212 having such a configuration to serve as an output buffer carries out AB-class push-pull operations.

The negative-polarity OTA 221 employs PMOS (p-channel MOS) transistors PT221 and PT222 each serving as a transistor of a first conduction type, NMOS (n-channel MOS) transistors NT221 and NT222 each serving as a transistor of a second conduction type as well as a current source I221.

The source electrode of the PMOS transistor PT221 and the source electrode of the PMOS transistor PT222 are connected to a connection point wired to the source terminal of the current source I221 which has its drain terminal connected to the power-supply electric potential Vdd.

The drain electrode of the PMOS transistor PT221 and the drain electrode of the NMOS transistor NT221 are connected to a connection point serving as a node ND221. The drain and gate electrodes of the NMOS transistor NT221 are connected to a connection point wired to the gate electrode of the NMOS transistor NT222. That is to say, the node ND221 is connected to the gate electrode of the NMOS transistor NT221 and the gate electrode of the NMOS transistor NT222.

The drain electrode of the PMOS transistor PT222 and the drain electrode of the NMOS transistor NT222 are connected to a connection point serving as an output node ND222 which is also the output terminal of the negative-polarity OTA 221.

The source electrode of the NMOS transistor NT221 and the source electrode of the NMOS transistor NT222 are connected to a connection point wired to the ground electric potential GND.

The gate electrode of the PMOS transistor PT221 serves as the non-inverting (+) of the negative-polarity OTA 221 whereas the gate electrode of the PMOS transistor PT222 serves as the inverting (−) of the negative-polarity OTA 221.

Since the non-inverting (+) of the negative-polarity OTA 221 is connected to the terminal a of the seventh switch SW237 and the terminal a of the eighth switch SW238, the gate electrode of the PMOS transistor PT221 is also connected to the terminals a of the seventh switch SW237 and the eighth switch SW238. Since the inverting (−) of the negative-polarity OTA 221 is connected to an input terminal TI2 wired to an output terminal (DAC_LOWER) of the DAC 123, the gate electrode of the PMOS transistor PT222 is also connected to the input terminal TI2.

The output node ND222 of the negative-polarity OTA 221 is connected to the terminal a of the third switch SW233 and the terminal a of the fourth switch SW234.

A differential amplifier including the PMOS transistor PT221 and the PMOS transistor PT222 in the negative-polarity OTA 221 having such a configuration amplifies the difference between a signal output by the DAC 123 (DAC_LOWER) and a signal output by the second common OAMP 222 or the first common OAMP 212 and outputs a data signal obtained as a result of the amplification to the second input terminal of the second common OAMP 222 by way of the third switch SW233 or the second input terminal of the first common OAMP 212 by way of the fourth switch SW234.

The second common OAMP 222 employs a PMOS transistor PT223, an NMOS transistor NT223, current sources I222 and I223 as well as a transfer gate TMG221. The transfer gate TMG221 employs a PMOS transistor PT224 and an NMOS transistor NT224 by connecting the source electrode of the PMOS transistor PT224 to the drain electrode of the NMOS transistor NT224 and connecting the drain electrode of the PMOS transistor PT224 to the source electrode of the NMOS transistor NT224.

The source electrode of the PMOS transistor PT223 is connected to the power-supply electric potential Vdd whereas the drain electrode of the PMOS transistor PT223 and the drain electrode of the NMOS transistor NT223 are connected to a connection point serving as an output node ND223 which is the output terminal of the second common OAMP 222. The source electrode of the NMOS transistor NT223 is connected to the ground electric potential GND.

The drain terminal of the current source I222 is connected to the power-supply electric potential Vdd. The source terminal of the current source I222, the gate electrode of the PMOS transistor PT223 and an input/output terminal T221 of the transfer gate TMG221 are connected to a connection point serving as an input node ND224 which is the first input terminal of the second common OAMP 222.

The source terminal of the current source I223 is connected to the ground electric potential GND. The drain terminal of the current source I223, the gate electrode of the NMOS transistor NT223 and an input/output terminal T222 of the transfer gate TMG221 are connected to a connection point serving as an input node ND225 which is the second input terminal of the second common OAMP 222.

A first bias signal BIAS1 is supplied to the gate electrode of the PMOS transistor PT224 employed in the transfer gate TMG221 whereas a second bias signal BIAS2 is supplied to the gate electrode of the NMOS transistor NT224 employed in the transfer gate TMG221.

The first and second bias signals BIAS1 and BIAS2 are applied to the gate electrodes as voltages used for setting a DC current flowing to the second common OAMP 222 provided at the output stage.

The output node ND223 of the second common OAMP 222 is connected to an output terminal TO2 for channel CH2. The input node ND224 of the second common OAMP 222 is connected to the terminal b of the second switch SW232 whereas the input node ND225 of the second common OAMP 222 is connected to the terminal b of the third switch SW233.

The second common OAMP 222 having such a configuration to serve as an output buffer carries out AB-class push-pull operations.

As described above, in the configuration shown in the circuit diagram of FIG. 8 as a typical configuration of the output buffer section 200, the positive-polarity OTA 211 is configured to employ a differential amplifier including the NMOS transistor NT211 and the NMOS transistor NT212 whereas the negative-polarity OTA 221 is configured to employ a differential amplifier including the PMOS transistor PT221 and the PMOS transistor PT222.

Since each of the first common OAMP 212 and the second common OAMP 222 each serving as an output-stage buffer carries out an AB-class push-pull operation whereas the outputs of the positive-polarity OTA 211 and the negative-polarity OTA 221 have operating points different from each other, each of the first common OAMP 212 and the second common OAMP 222 is provided with 2 input terminals which are connected to 2 different nodes respectively.

By referring to the block diagram of FIG. 7 and a timing diagram of FIG. 9, the following description explains operations carried out by the output buffer section 200 employed in the signal-line driving circuit 120 according to the embodiment. As described earlier, the output buffer section 200 is also denoted by reference numeral 124 in this patent specification.

Figures 9A, 9B, 9C, 9D:
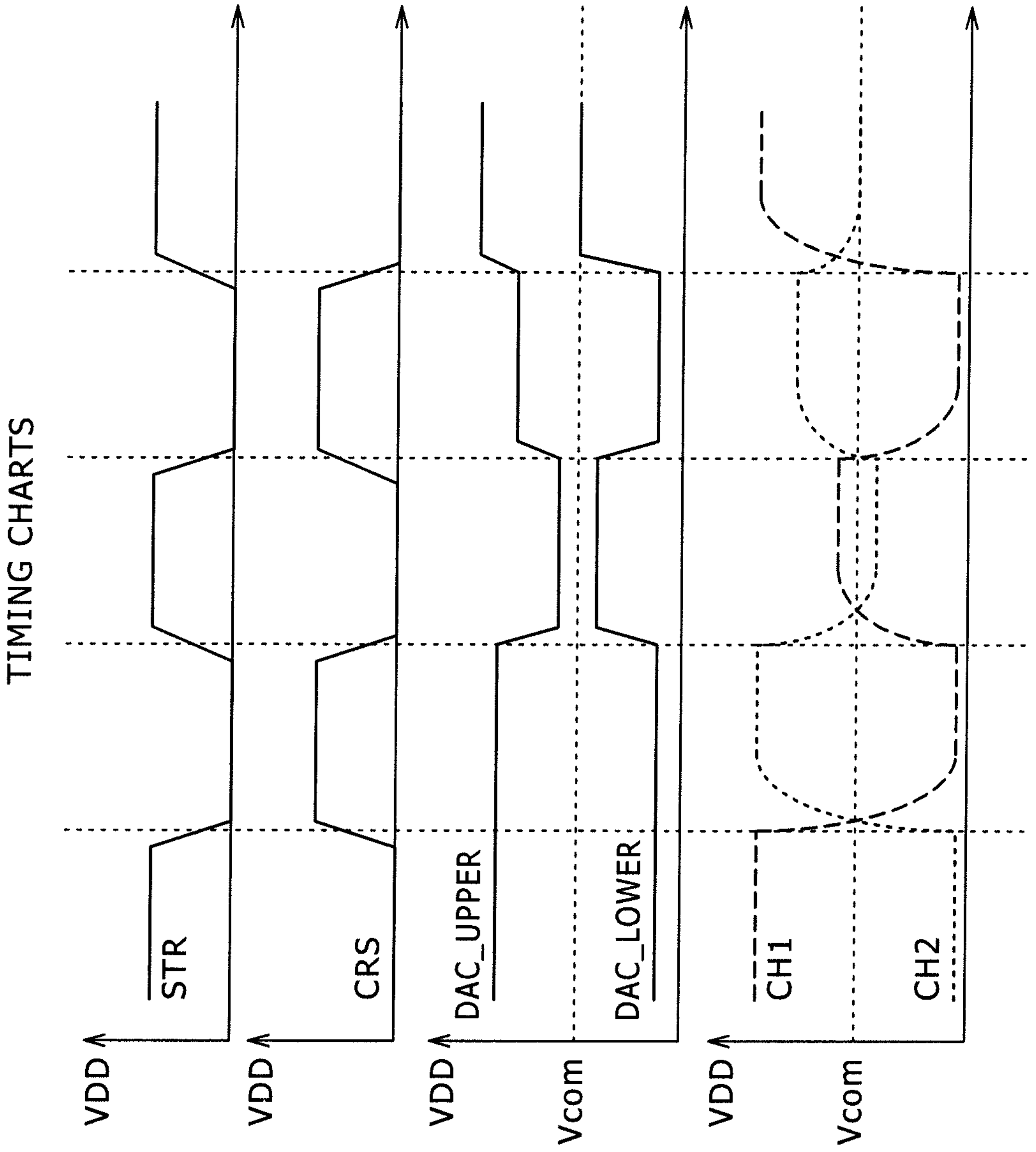
FIGS. 9A, 9B, 9C and 9D are timing diagrams showing a plurality of timing charts referred to in description of operations carried out by the output buffer section employed in the signal-line driving circuit according to the embodiment.

It is to be noted that FIG. 9 is a timing diagram showing a plurality of timing charts referred to in description of the operations carried out by the output buffer section 200 employed in the signal-line driving circuit 120 according to the embodiment. To be more specific, FIG. 9A shows the timing chart of the switch signal STR whereas FIG. 9B shows the timing chart of the switch signal CRS. FIG. 9C shows the timing charts of the levels of signals DAC_UPPER and DAC_LOWER generated by the DAC 123 whereas FIG. 9D shows the timing charts of the levels of signals output for channels CH1 and CH2.

The output buffer section 200 adopts a technique different from the output selector method explained earlier by referring to the block diagram of FIG. 3. In accordance with the technique adopted by the output buffer section 200, the first and second input terminals of the first common OAMP 212 and the first and second input terminals of the second common OAMP 222 are connected to the switches SW231 to SW234 provided at a stage immediately preceding the first common OAMP 212 and the second common OAMP 222 in order to switch signals supplied to the first common OAMP 212 and the second common OAMP 222, which are provided at the output stage for channels CH1 and CH2 respectively, in a mutually complementary manner.

In addition, the switches SW235 to SW238 are provided on feedback paths to the positive-polarity OTA 211 and the negative-polarity OTA 221 as switches for switching signals fed back to the positive-polarity OTA 211 and the negative-polarity OTA 221 in a mutually complementary manner.

In such a configuration, in the first mode with the switch signal STR set at a high level and the switch signal CRS set at a low level, each of the switches SW231, SW233, SW235 and SW237 pertaining to the first switch group of the switch group 230 is in a turned-on state whereas each of the switches SW232, SW234, SW236 and SW238 pertaining to the second switch group of the switch group 230 is in a turned-off state.

In these states of the first mode, a positive-polarity signal voltage generated by the positive-polarity OTA 211 is supplied to a first signal line $\mathbf{112}_m$ by way of the first common OAMP 212 whereas a negative-polarity signal voltage generated by the negative-polarity OTA 221 is supplied to a second signal line $\mathbf{112}_{m+1}$ by way of the second common OAMP 222.

In the second mode with the switch signal STR set at a low level and the switch signal CRS set at a high level, on the other hand, each of the switches SW231, SW233, SW235 and SW237 pertaining to the first switch group of the switch group 230 is in a turned-off state whereas each of the switches SW232, SW234, SW236 and SW238 pertaining to the second switch group of the switch group 230 is in a turned-on state.

In these states of the second mode, a positive-polarity signal voltage generated by the positive-polarity OTA 211 is supplied to the second signal line $\mathbf{112}_{m+1}$ by way of the second common OAMP 222 whereas a negative-polarity signal voltage generated by the negative-polarity OTA 221 is supplied to the first signal line $\mathbf{112}_m$ by way of the first common OAMP 212.

By employing the output buffer section 200 provided with such a configuration in accordance with the embodiment, each of the signal voltage generated by the positive-polarity OTA 211 and the signal voltage generated by the negative-polarity OTA 221 can be switched from the positive polarity to the negative polarity and vice versa without providing switches (SW) on the output paths of the output buffer section 200.

Since no switches (SW) are provided on the output paths of the output buffer section 200, the settling process ends early in comparison with the configuration adopting the output selector method.

In the configuration according to the embodiment, each of the first common OAMP 212 and the second common OAMP 222 which are provided at the output stage is an amplifier common to the positive-polarity OTA 211 and the negative-polarity OTA 221.

In the configuration shown in the block diagram of FIG. 7 and the circuit diagram of FIG. 8 as a typical configuration of the output buffer section 200, each of the first common OAMP 212 and the second common OAMP 222 which are placed at the output stage is provided with 2 input terminals. It is to be noted, however, that the scope of the present embodiment is by no means limited to this output buffer section 200 employed in the signal-line driving circuit 120 according to the embodiment. For example, each of the first common OAMP 212 and the second common OAMP 222 can also be provided with 1 input terminal.

Figures 10A, 10B:
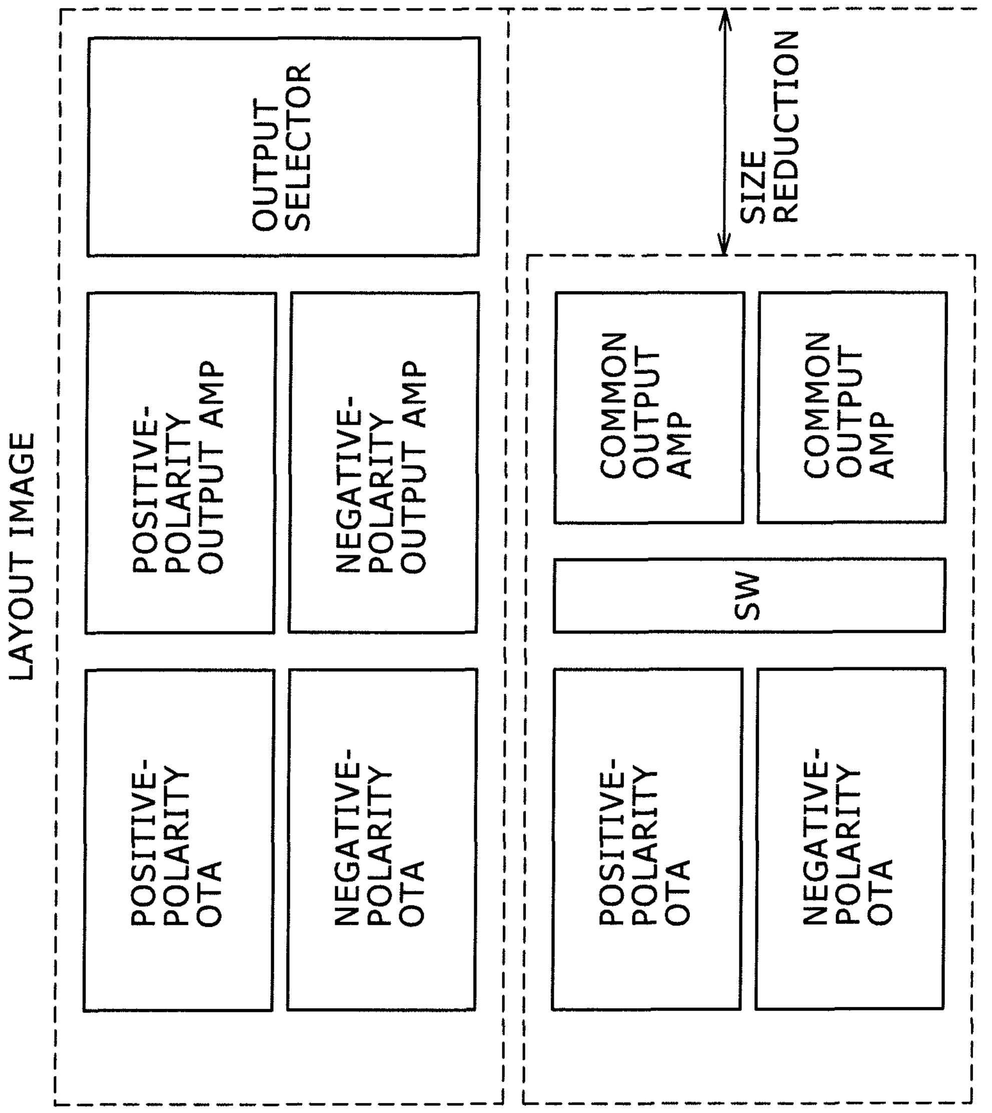
FIGS. 10A and 10B are plurality of diagrams referred to in comparing a configuration adopting the output selector method explained earlier by referring to the block diagram of FIG. 3 with the configuration of the output buffer section employed in the signal-line driving circuit according to the embodiment.

FIGS. 10A and 10B are a plurality of diagrams referred to in comparing the configuration adopting the output selector method explained earlier by referring to the block diagram of FIG. 3 with the configuration of the output buffer section 200 employed in the signal-line driving circuit 120 according to the embodiment.

As shown in the diagram of FIG. 10B, since the switches (SW) are not provided on the output paths of the output buffer section 200, it is not necessary to reduce the turned-on-state resistances of the switches (SW). Thus, the sizes of the switches (SW) can be decreased.

In addition, since no switches (SW) are connected to each other in series, each of the size of the first common OAMP 212 and the size of the second common OAMP 222 can also be reduced as well.

Figure 11A:
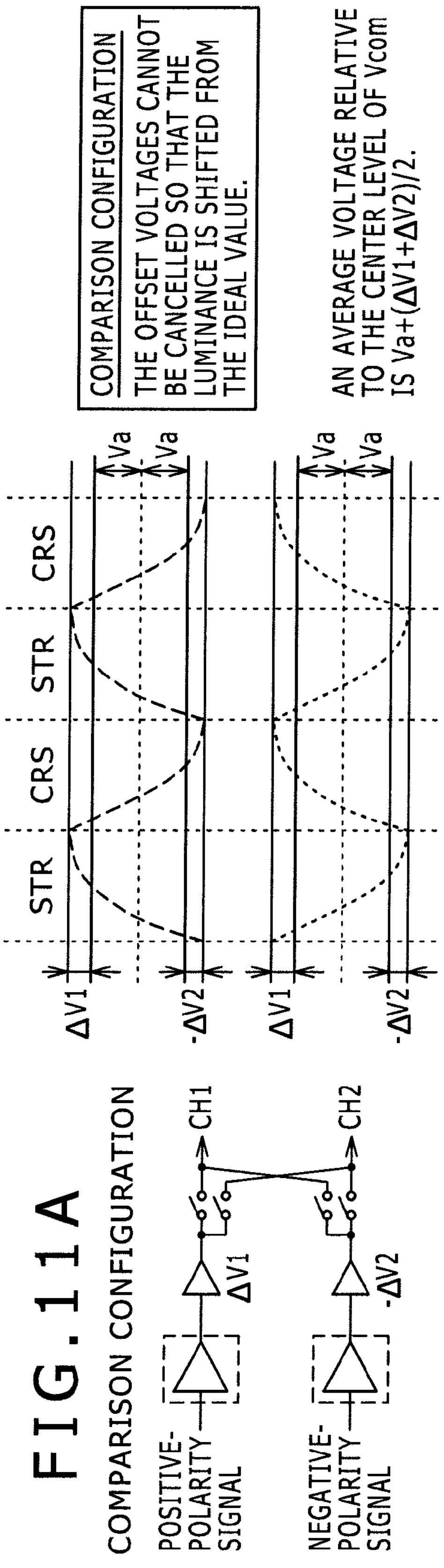
FIGS. 11A and 11B are plurality of diagrams used for showing differences between the appearances of voltages at a bias stage of the configuration adopting the output selector method and the appearances of voltages at a bias stage of the output buffer section employed in the signal-line driving circuit according to the embodiment and referred to in comparing offset-voltage effects caused by amplifiers provided at the output stage.
Figure 11B:
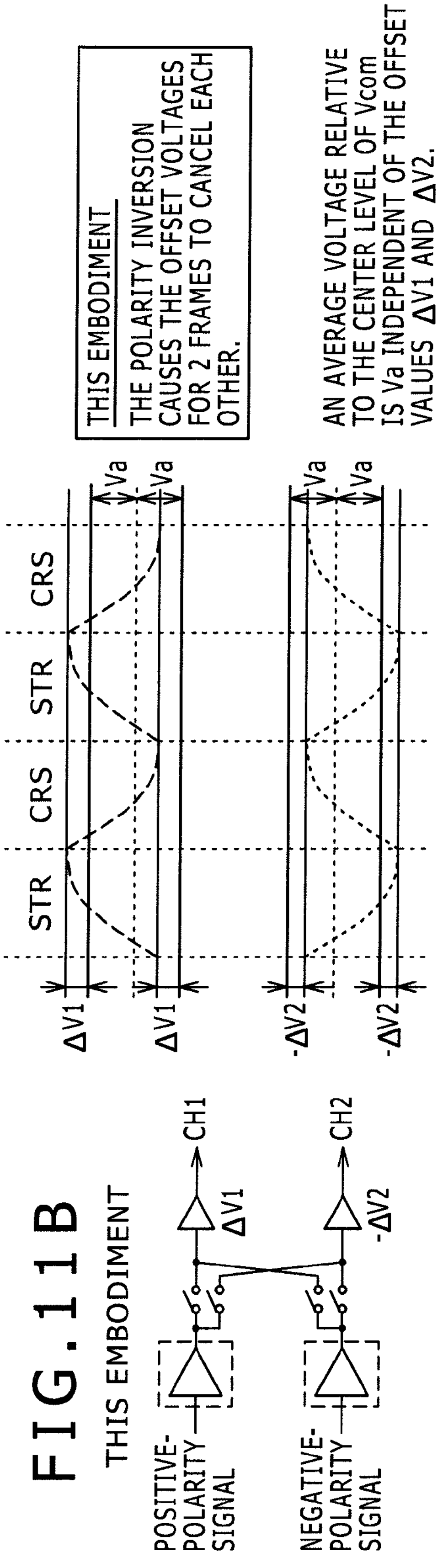

FIGS. 11A and 11B are a plurality of diagrams used for showing differences between the appearances of voltages at a bias stage of the configuration adopting the output selector method and the appearances of voltages at a bias stage of the output buffer section 200 employed in the signal-line driving circuit 120 according to the embodiment. The diagrams of FIG. 11 are to be referred to in comparing offset-voltage effects caused by the amplifiers provided at the output stage.

If the voltage offsets caused by the amplifiers provided at the output stage match each other, in the configuration adopting the output selector method, the offset voltages cannot be cancelled as shown in the diagram of FIG. 11A so that the luminance is shifted from the ideal value.

In the case of the output selector method, an average voltage relative to the center level of a common voltage Vcom is represented by an expression of $Va+(\Delta V1+\Delta V2)/2$ indicating that the offset values $\Delta V1$ and $\Delta V2$ are not cancelled.

In accordance with the output buffer section 200 employed in the signal-line driving circuit 120 according to the embodiment, on the other hand, the polarity inversion causes the offset voltages for 2 frames to cancel each other as shown in the diagram of FIG. 11B.

In the case of the output buffer section 200 employed in the signal-line driving circuit 120 according to the embodiment, an average voltage relative to the center level of the common voltage Vcom is Va which is independent of the offset values $\Delta V1$ and $\Delta V2$.

As described above, in accordance with this embodiment, the output buffer section 200 employs the positive-polarity OTA 211, the first common OAMP 212, the negative-polarity OTA 221, the second common OAMP 222 and the switch group 230 which together exhibits effects described below. As explained before, the positive-polarity OTA 211 is a component having a function to amplify input data received from the DAC 123 (DAC_UPPER) provided at the stage immediately preceding the output buffer section 200 in order to generate a signal voltage with the positive polarity. The first common OAMP 212 is a component having the function of an output buffer for supplying a signal voltage with the positive or negative polarity to a first signal line $\mathbf{112}_m$ connected to channel $CH_m$, that is, channel CH1 for m=1 for example. By the same token, the negative-polarity OTA 221 is a component having a function to amplify input data received from the DAC 123 (DAC_LOWER) provided at the stage immediately preceding the output buffer section 200 in order to generate a signal voltage with the negative polarity. The second common OAMP 222 is a component having the function of an output buffer for supplying a signal voltage with the positive or negative polarity to a second signal line $\mathbf{112}_{m+1}$ connected to channel $CH(_{m+1})$ that is, channel CH2 for m=1. The switch group 230 consists of switches ranging from a first switch SW231 to an eighth switch SW238. The first switch SW231 is a switch connected between the output terminal of the positive-polarity OTA 211 and a first input terminal of the first common OAMP 212. The second switch SW232 is a switch connected between the output terminal of the positive-polarity OTA 211 and a first input terminal of the second common OAMP 222. The third switch SW233 is a switch connected between the output terminal of the negative-polarity OTA 221 and a second input terminal of the second common OAMP 222. The fourth switch SW234 is a switch connected between the output terminal of the negative-polarity OTA 221 and a second input terminal of the first common OAMP 212. The fifth switch SW235 is a switch connected between the output terminal of the first common OAMP 212 and the non-inverting (+) input terminal of the positive-polarity OTA 211. The sixth switch SW236 is a switch connected between the output terminal of the second common OAMP 222 and the non-inverting (+) input terminal of the positive-polarity OTA 211. The seventh switch SW237 is a switch connected between the output terminal of the second common OAMP 222 and the non-inverting (+) input terminal of the negative-polarity OTA 221. The eighth switch SW238 is a switch connected between the output terminal of the first common OAMP 212 and the non-inverting (+) input terminal of the negative-polarity OTA 221.

Since the switches (SW) are not provided on the output paths of the output buffer section 200, that is, since the switches (SW) are provided inside the output buffer section 200, the sizes of the switches (SW) can be reduced. Thus, the layout area can be decreased as well.

In addition, since the switches (SW) are not provided on the output paths of the output buffer section 200, the MOS sizes at the output stages of the output buffer section 200 can be reduced. Thus, the layout area can be decreased as well.

On top of that, since the switches (SW) are not provided on the output paths of the output buffer section 200, the settling process and, hence, the characteristic of the output buffer section 200 can be improved.

In addition, the polarity inversion causes the offset voltages caused by the amplifiers at the output stage of the output buffer section 200 for 2 frames to cancel each other. It is thus possible to improve the characteristic of the output buffer section 200 and, hence, the picture quality.

The embodiment described above implements a liquid-crystal display device of the active matrix type. It is to be noted, however, that the scope of the present invention is by no means limited to the active-matrix liquid-crystal display device according to the embodiment. That is to say, the present invention can also be applied to an other active-matrix display device of the active-matrix type. An example of the other active-matrix display device of the active-matrix type is an active-matrix organic EL (Electro Luminescence) display device employing pixel circuits each including an organic EL element as an electro optical element.

In addition, it should be understood by those skilled in the art that a variety of modifications, combinations, sub-combinations and alterations may occur, depending on design requirements and other factors as far as they are within the scope of the appended claims or the equivalents thereof.

The active-matrix liquid-crystal display device according to the present embodiment described above is employed in a variety of electronic equipments shown in diagrams of FIGS. 12 to 16 as electronic equipments used in all fields. Examples of the electronic equipments are a digital camera, a notebook personal computer, a portable terminal such as a cellular phone and a video camera. In each of these electronic equipments, the liquid-crystal display device is used for displaying a video signal supplied thereto or generated therein as an image or a video. The following description explains concrete implementations of the electronic equipment to which the present embodiment is applied.

Figure 12:
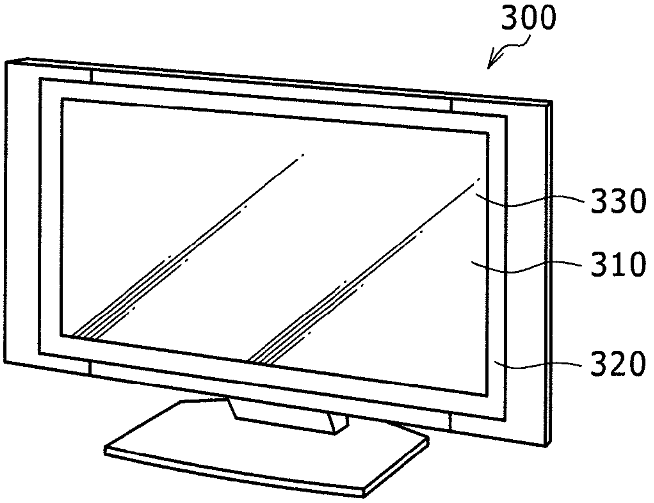
FIG. 12 is a diagram showing a squint view of the external appearance of a TV set to which the present embodiment is applied.

FIG. 12 is a diagram showing a squint view of the external appearance of a TV set 300 to which the present embodiment is applied. The TV set 300 serving as a typical implementation of the electronic equipment to which the present embodiment is applied employs a front panel 320 and a video display screen section 310 which is for example a filter glass plate 330. The TV set 300 is constructed by employing the liquid-crystal display device provided by the present embodiment in the TV set as the video display screen section 310.

Figure 13A:
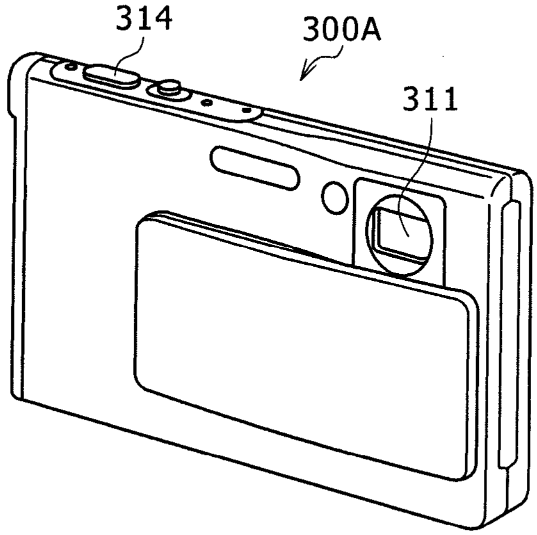
FIGS. 13A and 13B are plurality of diagrams each showing a squint view of the external appearance of a digital camera to which the present embodiment is applied.
Figure 13B:
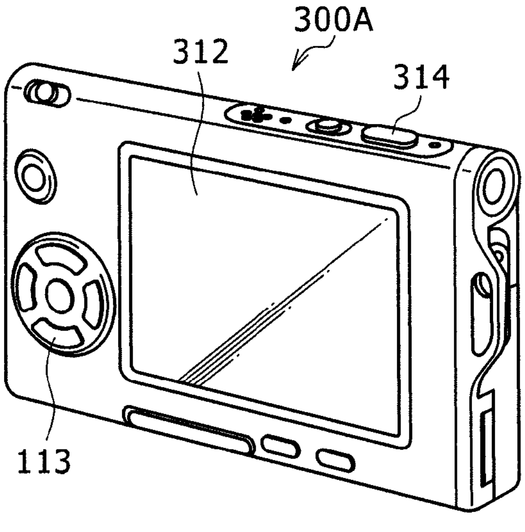

FIGS. 13A and 13B are a plurality of diagrams each showing a squint view of the external appearance of a digital camera 300A to which the present embodiment is applied. To be more specific, FIG. 13A is a diagram showing a squint view of the external appearance of the digital camera 300A seen from a position on the front side of the digital camera whereas FIG. 13B is a diagram showing a squint view of the external appearance of the digital camera 300A seen from a position on the rear side of the digital camera.

The digital camera 300A serving as a typical implementation of the electronic equipment to which the present embodiment is applied employs a light emitting section 311 for generating a flash, a display section 312, a menu switch 113 and a shutter button 314. The digital camera 300A is constructed by employing the liquid-crystal display device provided by the present embodiment in the digital camera 300A as the display section 312.

Figure 14:
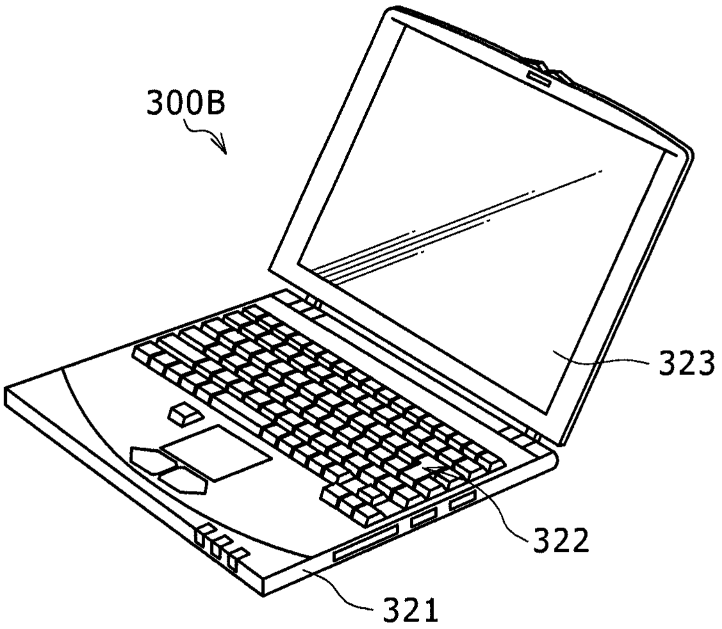
FIG. 14 is a diagram showing a squint view of the external appearance of a notebook personal computer to which the present embodiment is applied.

FIG. 14 is a diagram showing a squint view of the external appearance of a notebook personal computer 300B to which the present embodiment is applied. The notebook personal computer 300B serving as a typical implementation of the electronic equipment to which the present embodiment is applied employs a main body 321 including a keyboard 322 to be operated by the user for entering characters and a display section 323 for displaying an image. The notebook personal computer 300B is constructed by employing the liquid-crystal display device provided by the present embodiment in the personal computer 300B as the display section 323.

Figure 15:
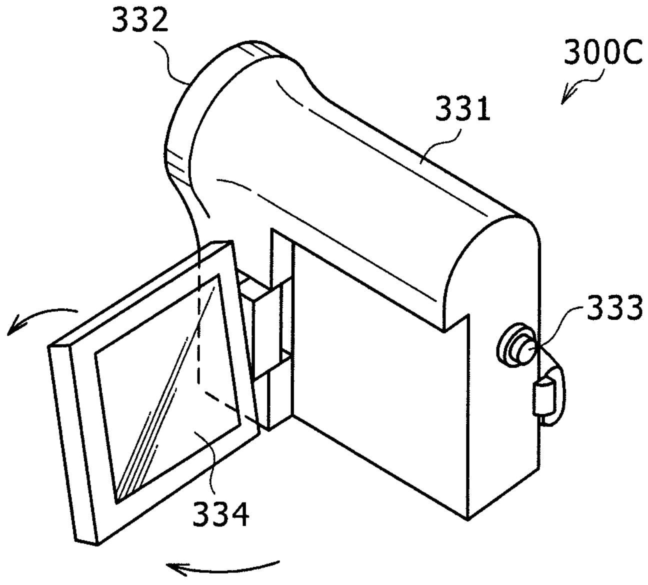
FIG. 15 is a diagram showing a squint view of the external appearance of a video camera to which the present embodiment is applied.

FIG. 15 is a diagram showing a squint view of the external appearance of a video camera 300C to which the present embodiment is applied. The video camera serving 300C as a typical implementation of the electronic equipment to which the present embodiment is applied employs a main body 331, a photographing lens 332, a start/stop switch 333 and a display section 334. Provided on the front face of the video camera, the photographing lens 332 oriented forward is a lens for taking a picture of a subject of photographing. The start/stop switch 333 is a switch to be operated by the user to start or stop a photographing operation. The video camera 300C is constructed by employing the liquid-crystal display device provided by the present embodiment in the video camera 300C as the display section 334.

Figures 16A, 16B, 16C, 16D, 16E, 16F, 16G:
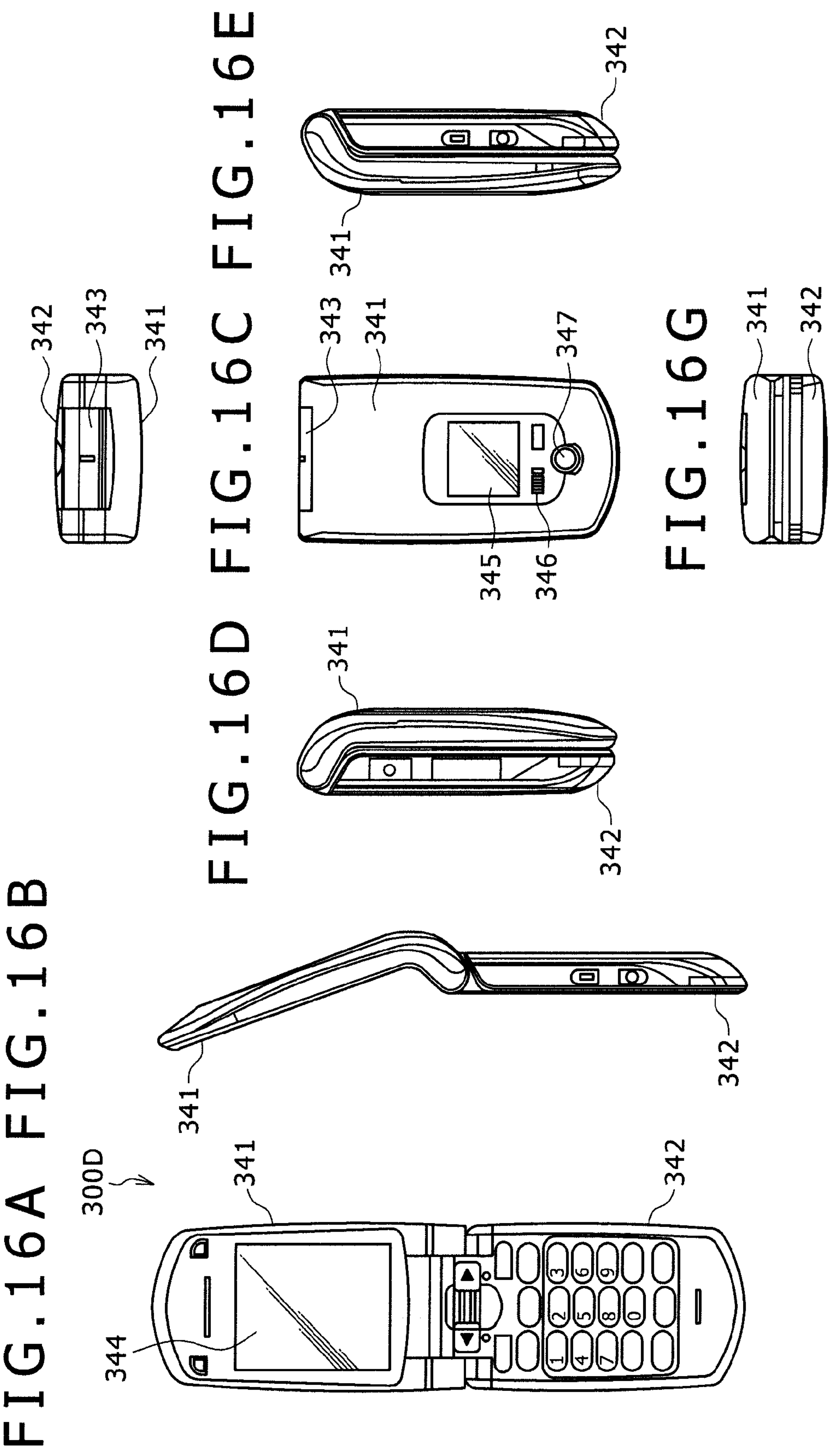
FIGS. 16A, 16B, 16C, 16D, 16E 16F and 16G are plurality of diagrams each showing the external appearance of a portable terminal such as a cellular phone to which the present embodiment is applied.

FIG. 16 is a plurality of diagrams each showing the external appearance of a portable terminal such as a cellular phone 300D to which the present embodiment is applied. To be more specific, FIG. 16A is a diagram showing the front view of the cellular phone 300D in a state of being already opened. FIG. 16B is a diagram showing a side of the cellular phone 300D in a state of being already opened. FIG. 16C is a diagram showing the front view of the cellular phone 300D in a state of being already closed. FIG. 16D is a diagram showing the left side of the cellular phone 300D in a state of being already closed. FIG. 16E is a diagram showing the right side of the cellular phone 300D in a state of being already closed. FIG. 16F is a diagram showing the top view of the cellular phone 300D in a state of being already closed. FIG. 16G is a diagram showing the bottom view of the cellular phone 300D in a state of being already closed.

The cellular phone 300D serving as a typical implementation of the electronic equipment to which the present embodiment is applied employs an upper case 341, a lower case 342, a link section 343 which is a hinge, a display section 344, a display sub-section 345, a picture light 346 and a camera 347. The cellular phone 300D is constructed by employing the liquid-crystal display device provided by the present embodiment in the cellular phone 300D as the display section 344 and/or the display sub-section 345.

What is claimed is:

1. A signal-line driving circuit comprising:

a display cell supplied with a signal voltage having a positive or negative polarity from signal lines and being arranged in a matrix:

circuitry configured to amplify input data, which is used for driving said signal lines and selectively supplying said signal voltage having said positive polarity and said signal voltage having said negative polarity to a pair of first and second ones of said signal lines, wherein said circuitry is comprised of:

a positive-polarity operating amplifier configured to amplify said input data in order to generate said signal voltage having said positive polarity;

a negative-polarity operating amplifier configured to amplify said input data in order to generate said signal voltage having said negative polarity;

a first output buffer configured to supply a signal voltage having said positive polarity or a signal voltage having said negative polarity to said first signal line;

a second output buffer configured to supply a signal voltage having said positive polarity or a signal voltage having said negative polarity to said second signal line; and first switches placed at the output of said positive-polarity operating amplifier for selectively connecting the output of said positive polarity operating amplifier to either an input of said first output buffer or an input of the second output buffer, and second switches at the output of said negative-polarity operating amplifier for selectively connecting the output of said negative polarity operating amplifier to either an input of said second output buffer or an input of the first output buffer, and a first pair of feedback switches at the feedback input stage of said positive-polarity operating amplifier; and a second pair of feedback switches at the feedback input stage of said negative-polarity operating amplifier for selectively connecting as a feedback signal either an output from the first output buffer or the second output buffer to either one of the operating amplifiers; and further wherein there is no switch placed between the output of said first output buffer and said first signal line and between the output of said second output buffer and said second signal line.

2. The signal-line driving circuit according to claim 1 wherein:

said positive-polarity operating amplifier has a differential amplifier including a pair of first-conduction transistors;

said negative-polarity operating amplifier has a differential amplifier including a pair of second-conduction transistors; and each of said first and second output buffers has an AB-class push-pull operation function.

3. The signal-line driving circuit according to claim 2 wherein each of said first and second output buffers has two input terminals.

4. The signal-line driving circuit according to claim 1, wherein the outputs of the first and second output buffers being directly connected to the pixels of a display, the switches being arranged such that there are two switches at the output of the positive-polarity operating amplifier and two switches at the output negative-polarity operating amplifier.

5. A display device comprising:

a display section having display cells arranged in a matrix subjected to a polarity inversion driving operation; and a signal-line driving circuit configured to supply a signal voltage having a positive or negative polarity to each of signal lines connected to said display cells in said polarity inversion driving operation;

wherein said signal-line driving circuit employs circuitry configured to amplify input data which is used for driving said signal lines and selectively supplying said signal voltage having said positive polarity and said signal voltage having said negative polarity to a pair of first and second ones of said signal lines as an output buffer section including a positive-polarity operating amplifier configured to amplify said input data in order to generate said signal voltage having said positive polarity;

a negative-polarity operating amplifier configured to amplify said input data in order to generate said signal voltage having said negative polarity;

a first output buffer configured to supply a signal voltage having said positive polarity or a signal voltage having said negative polarity to said first signal line;

a second output buffer configured to supply a signal voltage having said positive polarity or a signal voltage having said negative polarity to said second signal line; and first switches placed at the output of said positive-polarity operating amplifier for selectively connecting the output of said positive polarity operating amplifier to either an input of said first output buffer or an input of the second output buffer, and second switches at the output of said negative-polarity operating amplifier for selectively connecting the output of said negative polarity operating amplifier to either an input of said second output buffer or an input of the first output buffer, and a first pair of feedback switches at the feedback input stage of said positive-polarity operating amplifier; and a second pair of feedback switches at the feedback input stage of said negative-polarity operating amplifier for selectively connecting as a feedback signal either an output from the first output buffer or the second output buffer to either one of the operating amplifiers; and further wherein there is no switch placed between the output of said first output buffer and said first signal line and between the output of said second output buffer and said second signal line.

6. The display device according to claim 5 wherein:

said positive-polarity operating amplifier has a differential amplifier including a pair of first-conduction transistors;

said negative-polarity operating amplifier has a differential amplifier including a pair of second-conduction transistors; and each of said first and second output buffers has an AB-class push-pull operation function.

7. The display device according to claim 6 wherein each of said first and second output buffers has 2 input terminals.

8. An electronic equipment including a display device comprising:

a display section having display cells arranged in a matrix subjected to a polarity inversion driving operation; and a signal-line driving circuit configured to supply a signal voltage having a positive or negative polarity to each of signal lines connected to said display cells in said polarity inversion driving operation;

circuitry configured to amplify input data, which is used for driving said signal lines and selectively supplying said signal voltage having said positive polarity and said signal voltage having said negative polarity to a pair of first and second ones of said signal lines as an output section including a positive-polarity operating amplifier configured to amplify said input data in order to generate said signal voltage having said positive polarity;

a negative-polarity operating amplifier configured to amplify said input data in order to generate said signal voltage having said negative polarity;

a first output buffer configured to supply a signal voltage having said positive polarity or a signal voltage having said negative polarity to said first signal line;

a second output buffer configured to supply a signal voltage having said positive polarity or a signal voltage having said negative polarity to said second signal line; and first switches placed at the output of said positive-polarity operating amplifier for selectively connecting the output of said positive polarity operating amplifier to either an input of said first output buffer or an input of the second output buffer, and second switches at the output of said negative-polarity operating amplifier for selectively connecting the output of said negative polarity operating amplifier to either an input of said second output buffer or an input of the first output buffer; and a first pair of feedback switches at the feedback input stage of said positive-polarity operating amplifier, and a second pair of feedback switches at the feedback input stage of said negative-polarity operating amplifier for selectively connecting as a feedback signal either an output from the first output buffer or the second output buffer to either one of the operating amplifiers; and further wherein there is no switch placed between the output of said first output buffer and said first signal line and between the output of said second output buffer and said second signal line.

9. The electronic equipment according to claim 8, wherein the outputs of the first and second output buffers being directly connected to the pixels of a display, the switches being arranged such that there are two switches at the output of the positive-polarity operating amplifier and two switches at the output negative-polarity operating amplifier.

10. The electronic equipment according to claim 8 wherein:

said positive-polarity operating amplifier has a differential amplifier including a pair of first-conduction transistors;

said negative-polarity operating amplifier has a differential amplifier including a pair of second-conduction transistors; and each of said first and second output buffers has an AB-class push-pull operation function.

11. The electronic equipment according to claim 10 wherein each of said first and second output buffers has two input terminals.

* * * * *